United States Patent [19]

Miwa et al.

[11] Patent Number: 5,622,887

[45] Date of Patent: Apr. 22, 1997

[54] PROCESS FOR FABRICATING BICMOS DEVICES INCLUDING PASSIVE DEVICES

[75] Inventors: Hiroyuki Miwa, Kanagawa; Mamoru Shinohara; Takayuki Gomi, both of Tokyo; Tomotaka Fujisawa, Kanagawa, all of Japan

[73] Assignee: Sony Corporation, Tokyo, Japan

[21] Appl. No.: 323,873

[22] Filed: Oct. 17, 1994

Related U.S. Application Data

[62] Division of Ser. No. 189,191, Jan. 31, 1994, Pat. No. 5,414,291.

[30] Foreign Application Priority Data

| Jan. 30, 1993 | [JP] | Japan | 5-034871 |
| Jan. 30, 1993 | [JP] | Japan | 5-034872 |
| Feb. 28, 1993 | [JP] | Japan | 5-062979 |
| Mar. 4, 1993 | [JP] | Japan | 5-044105 |
| Mar. 31, 1993 | [JP] | Japan | 5-098788 |

[51] Int. Cl.⁶ .................................... H01L 21/70
[52] U.S. Cl. .................. 438/202; 438/384; 438/396; 438/210; 438/330
[58] Field of Search .................. 437/919, 918, 437/60, 47, 52, 59; 257/350, 351, 370, 379

[56] References Cited

U.S. PATENT DOCUMENTS

| 3,673,471 | 6/1972 | Klein et al. | 29/571 |
| 4,441,249 | 4/1984 | Alspector et al. | 437/60 |
| 4,841,481 | 6/1989 | Ikeda et al. | 257/379 |
| 4,984,200 | 1/1991 | Saitoo et al. | 257/370 |
| 4,994,887 | 2/1991 | Hutter et al. | 257/370 |
| 5,013,677 | 5/1991 | Hozumi | 437/47 |
| 5,047,826 | 9/1991 | Keller et al. | 357/42 |
| 5,055,905 | 10/1991 | Anmo | 357/51 |
| 5,059,549 | 10/1991 | Furuhata | 257/370 |
| 5,083,184 | 1/1992 | Eguchi | 357/51 |
| 5,286,991 | 2/1994 | Hui et al. | 437/919 |
| 5,336,632 | 8/1994 | Imamura | 437/919 |
| 5,356,826 | 10/1994 | Natsume | 437/919 |
| 5,395,782 | 3/1995 | Ohkoda et al. | 437/47 |
| 5,420,053 | 5/1995 | Miyazaki | 257/379 |

*Primary Examiner*—George Fourson
*Assistant Examiner*—Long Pham
*Attorney, Agent, or Firm*—Hill, Steadman & Simpson

[57] ABSTRACT

A semiconductor device comprising a MIS structure comprising a first electrically conductive film formed on an oxide film, a second electrically conductive film formed on at least a part of said first electrically conductive film, an insulator film formed on said second electrically conductive film, and a third electrically conductive film formed on said insulator film; and at least one electrode contact portion formed on said first electrically conductive film. A semiconductor device comprising a MIS capacitor having a diffusion layer inside the semiconductor substrate as a lower electrode with a first electrically conductive type being isolated using another diffusion layer having the opposite conductive type, and said another diffusion layer having the opposite conductive type being further isolated using a diffusion layer for isolation having the first conductive type and which is earthed. A BiCMOS semiconductor device comprising a resistor and an impurity source for the emitter and the emitter electrode for the bipolar transistor made of a same conductor layer, and further, a same conductor layer is provided as the contact electrode for the resistor and the gate for the MOS transistor. Also claimed are processes for fabricating the aforementioned semiconductor devices.

2 Claims, 33 Drawing Sheets related art

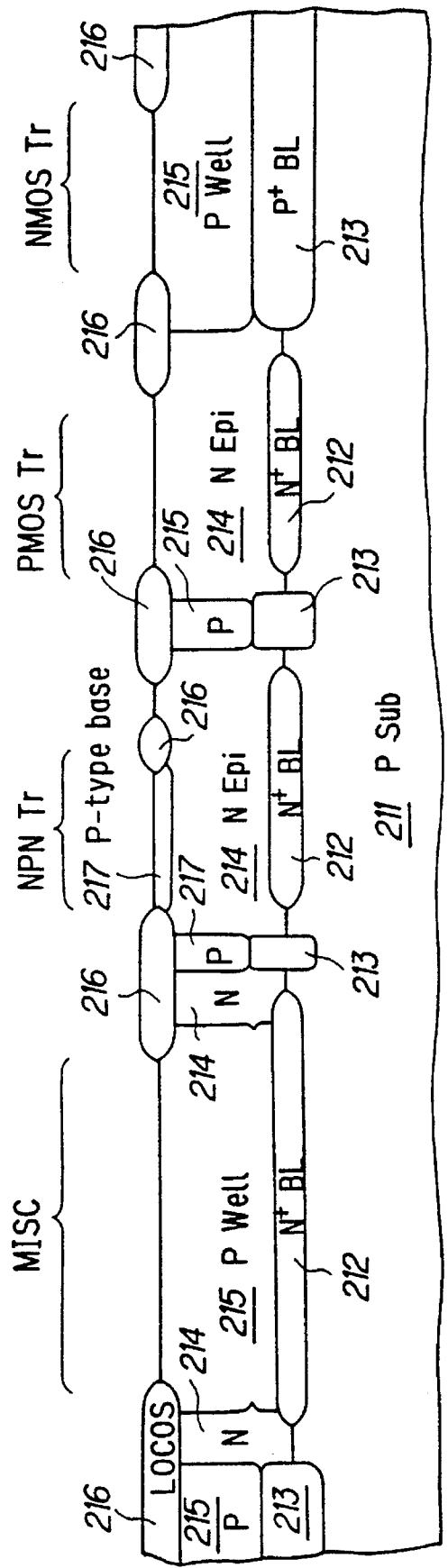

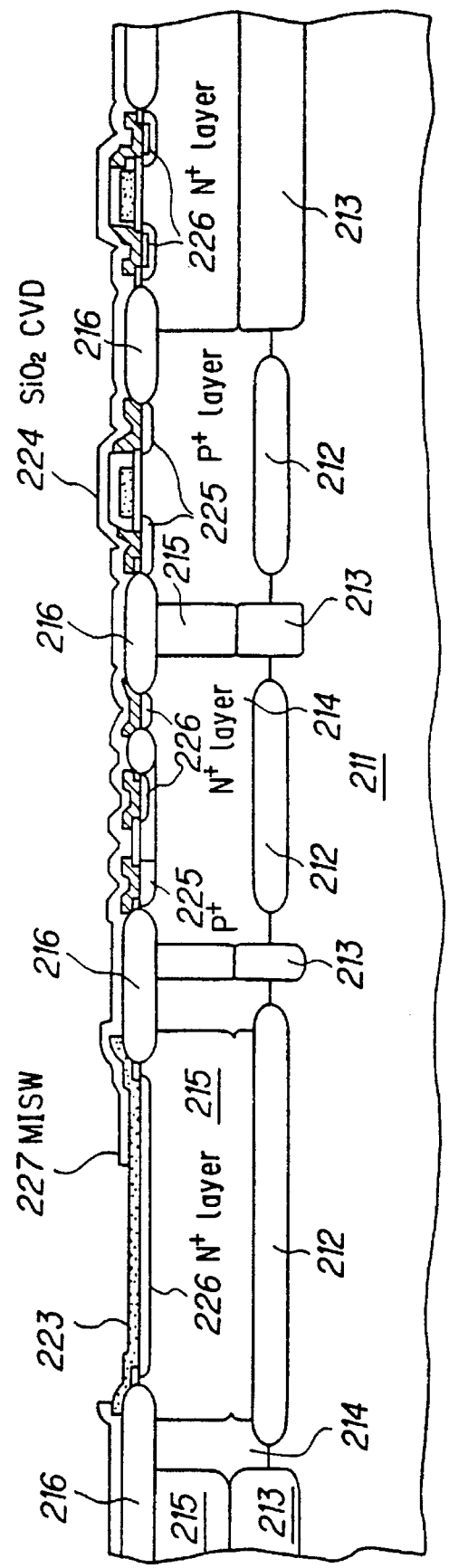

PROCESS FOR FABRICATING BICMOS DEVICES INCLUDING PASSIVE DEVICES

BACKGROUND OF THE INVENTION

This is a division of application Ser. No. 08/189,191, filed Jan. 31, 1994 now U.S. Pat. No. 5,414,291.

1. Field of the Invention

The present invention relates to a BiCMOS semiconductor device and to a process for fabricating the same. In particular, the present invention relates to a BiCMOS type semiconductor device comprising a resistance and a capacitance formed by a bipolar transistor, a MOS (metal oxide semiconductor) transistor, and a desired conductor film formed on the same substrate. The present invention also relates to a process for fabricating said device. In the present specification, the term "BiCMOS semiconductor device" refers collectively to semiconductor devices having both a bipolar transistor and a MOS transistor.

2. Prior Art

With increasing demand on higher performance and larger scale of integration, advanced LSIs furnished with both advantages of CMOS and BIPs (bipolar transistors) are attracting more attention. A BiCMOS LSI not only has the merits of a CMOS capable of realizing high integration (packing density) and low power consumption, but also has the superiority of BIP, i.e., high speed. In the field where LSIs of higher performance are required, in particular, it is essential to integrate the most advanced MOS technology and BIP technology. The trend in such advanced fields is, accordingly, employing a so-called LDD (lightly doped drain) structure for the MOS structure, and a so-called double polysilicon structure for the BIP structure.

Referring to FIGS. 2 to 4, the structure of two representative types of MIS (metal insulator semiconductor) capacitance are described below.

The structures illustrated in FIGS. 2 and 3 both comprise a first layer Al (aluminum) 19 as the upper electrode and an N-type plug 13 (see FIG. 2) or a combination of an N-type plug 17 with an N-type BL (buried layer) 13 (see FIG. 3) as the lower electrode. A dielectric film ($Si_3N_4$) 16 or 26 is incorporated in the structure. In this type of structure, noise, etc., ascribed to the fluctuation in substrate potential due to, e.g., the substrate current of digital MOS, directly affects the MIS capacitance through the N-type region.

In contrast to the above structure, another related art structure as illustrated in FIG. 4 comprises an impurity-doped polysilicon 33 on a field oxide film as the lower electrode. The MIS capacitance in this type of structure can be thereby maintained indifferent to the fluctuation in substrate potential. This time, however, the frequency characteristics of the MIS capacitance is impaired because the resistance of the polysilicon electrode 33 is too large. A MIM (metal insulator metal) structure using a metal such as aluminum is preferred for the lower electrode of the structure shown in FIG. 4, however, it is difficult to form a high quality thin film 34 of a dielectric such as $Si_3N_4$, because a high temperature over the melting point of aluminum, i.e., a temperature in the range of from 700° to 800° C., is necessary to deposit a dense $Si_3N_4$ film by CVD. A MIM structured lower electrode can be realized by using a refractory metal or a silicide thereof, such as W (tungsten) or $WSi_x$. However, thin films of these materials have inferior adhesibility to an insulator film, and they have poor affinity with a $Si_3N_4$ film having large tensile stress. Those shortcomings can be overcome only at the expense of increased process steps, and this is not necessarily practical. The above problems apply not only to a MIS capacitance but also to a MOS capacitance.

FIG. 5 illustrates a fourth type of a related art showing a representative MIS capacitance. The process steps for fabricating a related art BiCMOS LSI are explained in detail referring to FIGS. 5 to 8. In FIG. 8 are given cross sectional views of the upper portion on a silicon substrate, comprising a double polysilicon structured bipolar transistor portion Tr1 and a P-channel MOS transistor portion Tr2.

Referring to FIG. 5A, a buried $N^+$ layer 47 and a diffusion layer 41 are formed for a substrate 10, in the area for establishing the bipolar transistor portion Tr1. The buried layer 47 and the diffusion layer function as a contact for collector of an NPN transistor.

After forming a 400 to 500 nm thick LOCOS oxide film 57 and a $P^+$ diffusion layer 53 for element isolation, a 10 to 20 nm thick insulator film 41 is formed as a gate oxide film for the MOS transistor.

A polysilicon film from about 100 to 200 nm in thickness is deposited over the entire surface of the resulting structure by CVD. This film serves as a electrically conductive film 42. Openings corresponding to a base and an emitter forming portion are then perforated in the layered polysilicon/gate oxide film by a known dry etching technology.

The polysilicon film (the electrically conductive film 42) functions as a protective film for the gate oxide film during the formation of an opening. Hence, the polysilicon film prevents failure of withstand voltage due to pollution of the gate oxide film from occurring in the step of resist removal during the formation of the opening in the gate oxide film.

Referring to FIG. 5B, a 100 to 200 nm thick polysilicon film is then deposited by CVD to obtain a second electrically conductive film 44. Taking the previously CVD-deposited polysilicon film (conductive film 42) into account, a polysilicon film from 300 to 400 nm in total thickness is formed.

Subsequently, $N^+$ ions are ion-implanted into the gate contact region of the MOS transistor portion. After ion-implanting $P^+$ ions into the base contact forming region of the bipolar transistor portion, the layered polysilicon layer above (the first and second conductive films 42 and 44) is processed by a conventional dry etching technology except for the gate contact of the MOS transistor portion and the base contact of the bipolar transistor portion. Then, ion-implantation of $P^{31}$ ions is performed to form an LDD diffusion layer 54 in the MOS transistor portion.

A 200 to 400 nm thick $SiO_2$ film is deposited by CVD and then anisotropically etched by a known dry etching technology to form a sidewall-like $SiO_2$ spacer 56 for an LDD.

The base and emitter forming regions of the bipolar transistor can be protected from overetching because they are covered with polysilicon during the anisotropic etching in forming the $SiO_2$ spacer for the LDD. Accordingly, the element can be obtained free of problems such as element degradation due to RIE (reactive ion etching) damage and decrease in product yield. The MOS transistor portion is then subjected to ion-implantation of $P^+$ ions to form a source and drain diffusion layer 55.

Referring to FIG. 5C, a 300 to 400 nm thick $SiO_2$ is deposited by CVD, and the layered $SiO_2$/polysilicon film of the base and emitter regions of the bipolar transistor is removed by a known dry etching technology.

An $SiO_2$ film is deposited to a thickness of from 400 to 600 nm is deposited by CVD, and subjected to anisotropic etching by a known dry etching process to form an $SiO_2$ spacer 58 for the isolation of emitter and base contacts. A polysilicon film 42 for forming an emitter is deposited by CVD, and processed by a known dry etching technology. Base and emitter are then formed by implanting and diffusing ions into said polysilicon film.

P$^+$ions are diffused from the base take out electrode to form a graft base at the same time the source and drain diffusion layer of the MOS transistor is activated by the heat treatment.

Referring to FIG. 5D, a 300 to 400 nm thick SiO$_2$ film is deposited by CVD to establish an insulator film 45. Then, each of the electrodes (not shown in the figure) is formed by a known interconnection technology. The bipolar transistor portion Tr1 comprises a base Base, an emitter Em, and a collector Col, and the MOS transistor portion Tr2 comprises contact portions S and D for source and drain, respectively.

A MIS capacitor using SiN as the dielectric is promising from the viewpoint of its applicability to an Active Pull-down circuit and the like. Special notice is presently taken of an Active Pull-down circuit as a technology which realizes a low power consuming high speed bipolar ECL (emitter coupled logic) gate. Since a high precision capacitance should be added to a conventional type BiCMOS LSI for the implementation of the Active Pull-down circuit, the use of a MIS capacitor having a large capacitance per unit of area and a favorable controllability is preferred.

A related art process for fabricating a BiCMOS LSI having an additional capacitance of high precision is described referring to FIGS. 6A to 6C. FIGS. 6A to 6C show the cross sectional view of a MIS capacitor portion T1 and a P-channel MOS transistor portion T2 both formed on the upper side of a silicon substrate.

Referring to FIG. 6A, an N$^+$diffusion layer 67 is formed on the substrate forming a MIS capacitor T1 (sometimes referred to simply hereinafter as a "MIS capacitor T1 forming portion").

Referring to FIG. 6B, an insulator film (SiO$_2$) 61 of the MIS capacitor T1 forming portion is removed by a known dry etching process. Then, a 30 to 60 nm thick SiN is deposited by CVD, and processed by a known dry etching technology to leave over SiN as a dielectric film 63 on the MIS capacitor T1 forming portion.

Referring to FIG. 6C, a 300 to 400 nm thick SiO$_2$ film is deposited by CVD to provide an insulator film 65. Then, each of the electrodes (not shown in the figure) is formed by a conventional interconnection technology.

The conventional process for fabricating a BiCMOS LSI having an additional high precision capacitance as described in the foregoing, however, suffers the following problems: (1) A step must be newly added to the process for forming the MIS capacitor, because the insulator film on the MIS capacitor forming region must be removed by etching (see FIG. 6B); and (2) The contact on the SiN constituting the MIS capacitor must be formed separately from the other contacts in the contact forming step (see FIG. 6C). Since a conventional dry etching technology does not support an etching condition which realizes SiO$_2$ etching at a high selectivity ratio with respect to SiN, the opening on the SiN for a contact must be formed by wet etching using an hydrofluoric acid based solution. Such an etching process is not suited for fine processing.

A process for fabricating a BiCMOS LSI is described in detail referring to FIGS. 7 to 10. FIGS. 7 to 10 show the cross sectional view of double polysilicon structured bipolar transistor and a P-channel MOS transistor portion both formed on the upper portion of a silicon substrate.

Referring to FIG. 7A, a buried N$^+$layer 82 and a diffusion layer are formed in the bipolar transistor portion of a substrate 81. The buried layer 82 and the diffusion layer function as a contact for collector of an NPN transistor.

After forming a 400 to 500 nm thick LOCOS oxide film 83 and a P$^+$diffusion layer 84 for element isolation, a 10 to 20 nm thick insulator film 85 is formed as a gate oxide film.

A first polysilicon layer 86 from about 100 to 200 nm in thickness is then deposited over the entire surface of the resulting structure by CVD. Openings corresponding to a base and an emitter forming portion are then perforated in the layered polysilicon 86/gate oxide film 85 by a known dry etching technology.

The polysilicon film 86 functions as a protective film for the gate oxide film 85 during the formation of the opening. Hence, the polysilicon film prevents failure of withstand voltage due to pollution of the gate oxide film from occurring in the step of resist removal during the formation of the opening in the gate oxide film.

Referring to FIG. 7B, a 100 to 200 nm thick second polysilicon layer 87 is then deposited by CVD. This layer together with the previously CVD-deposited polysilicon film 86 gives a polysilicon film 300 to 400 nm in total thickness.

Subsequently, N$^+$ions are ion-implanted into the gate contact region of the MOS transistor portion. After ion-implanting P$^+$ions into the base contact forming region of the bipolar transistor portion, the layered polysilicon layer 87 above is processed by a conventional dry etching technology except for the gate contact of the MOS transistor portion and the base contact of the bipolar transistor portion.

Then, ion-implantation of P$^-$ions is performed to form an LDD diffusion layer 88 in the MOS transistor portion.

A 200 to 400 nm thick SiO$_2$ film is deposited by CVD and then anisotropically etched by a known dry etching technology to form a sidewall-like SiO$_2$ spacer 89 for an LDD.

The base and emitter forming regions of the bipolar transistor can be protected from overetching because they are covered with polysilicon during the anisotropic etching for forming the SiO$_2$ spacer 89 for the LDD. Accordingly, the element can be obtained free of problems such as element degradation due to RIE (reactive ion etching) damage and decrease in product yield. The MOS transistor portion is then subjected to ion-implantation of P$^+$ions to form a source and drain diffusion layer 90.

Referring to FIG. 7C, a 300 to 400 nm thick SiO$_2$ is deposited by CVD, and the layered SiO$_2$ 91/polysilicon film 87 of the base and emitter forming regions of the bipolar transistor is removed by a known dry etching technology.

An SiO$_2$ film is deposited to a thickness of from 400 to 600 nm by CVD, and subjected to anisotropic etching by a known dry etching process to form an SiO$_2$ spacer 92 for the isolation of emitter and base contacts.

A polysilicon film 93 for forming an emitter is deposited by CVD, and processed by a known dry etching technology. A base 95 and an emitter 94 are then formed by implantation and diffusion of ions into said polysilicon film. P$^+$ions are diffused from the base contact to form a graft base 96 at the same time the source and drain diffusion layer 90 of the MOS transistor is activated by the heat treatment.

Referring to FIG. 7D, a 300 to 400 nm thick SiO$_2$ film 97 is deposited by CVD to establish an insulator film 45. Then, each of the electrodes (not shown in the figure) is formed by a known interconnection technology.

Referring to FIG. 8, a seventh type of a related art structure is described below.

A MIS capacitor using SiN as the dielectric is promising from the viewpoint of its applicability to an Active Pull-down circuit and the like. Since special notice is taken of an Active Pull-down circuit as a technology which realizes a low power consuming high speed bipolar ECL (emitter coupled logic) gate, it is demanded that a high precision capacitance be added to a conventional type BiCMOS LSI for the implementation of the Active Pull-down circuit. Accordingly, the use of a MIS capacitor having a large capacitance per unit of area and a favorable controllability is preferred.

A related art process for fabricating a seventh related art BiCMOS LSI equipped with an additional high precision capacitance is described referring to FIGS. 8A to 8C. FIGS. 8A to 8C show the cross sectional view of a MIS capacitor portion and a P-channel MOS transistor portion T2 both formed on the upper side of a silicon substrate.

Referring to FIG. 8A, an N$^+$diffusion layer 102a is formed on the MIS capacitor forming portion.

Referring to FIG. 8B, an SiO$_2$ film 111 of the MIS capacitor forming portion is removed by a known dry etching process.

Then, a 30 to 60 nm thick SiN is deposited by CVD, and processed by a known dry etching technology to leave over SiN as a dielectric film 118 on the MIS capacitor forming portion.

Referring to FIG. 8C, a 300 to 400 nm thick SiO$_2$ film is deposited by CVD to provide an insulator film. Then, each of the electrodes (not shown in the figure) is formed by a conventional interconnection technology.

FIG. 9A shows a cross sectional view for the principal portion (the portion relating to the device according to the present invention) of an eighth type of a related art BiCMOS semiconductor device. Referring to FIG. 9, the device comprises a P-type substrate (having a resistivity of about 10 Ω·cm) 121, a buried N$^+$layer (containing diffused Nb and having a resistivity of about 20 Ω·m) 122, an N-type epitaxially grown layer (about 1 Ω·m in resistivity) 123, a P-type well layer 124, an N-type well layer 125, a LOCOS oxide film 126 about 500 nm in thickness, a first polysilicon layer (about 400 nm in thickness) 127 for forming a MOS gate, a P$^+$layer 129 for forming source and drain regions for PMOS transistor, a P$^+$base contact layer 129, a SiO$_2$ insulator film 130 having deposited by CVD using TEOS to a thickness of about 100 nm, a second polysilicon layer 131 about 70 nm in thickness to provide a polysilicon emitter, a second polysilicon layer 131 about 70 nm in thickness to give a polysilicon resistor, a BPSG reflow treated film 132 about 600 nm in thickness, and an aluminum connection 133.

A prior art BiCMOS semiconductor device is fabricated by the following process steps:

diffusing Sb inside a P-type substrate 121, followed by forming a buried N$^+$layer 122;

epitaxially growing an N-type epitaxial layer 123;

oxidizing to form a 50 nm thick oxide layer;

forming a mask pattern having a so-called "window" in the P-well forming region, and introducing boron by ion implantation to form a P-well;

forming in a similar manner as the previous step, an N-well by opening a window in the N-well forming region and introducing phosphorus by ion implantation;

subjecting the well to impurity diffusion to establish a P-well layer 124 and an N-well layer 125;

depositing an Si$_3$N$_4$ film by CVD to provide a masking layer against oxidation;

patterning the masking layer for LOCOS process, followed by oxidation to form a LOCOS oxide film 126;

after removing the Si$_3$N$_4$ masking layer, forming a gate oxide film;

forming a polysilicon gate;

subjecting the structure to ion implantation at a BF$_2$ dose of about $10^{14}$ to form Base;

performing ion implantation at a BF$_2$ dose of about $10^{16}$ to form a P$^+$layer;

depositing an SiO$_2$ layer by CVD using TEOS, to thereby obtain an insulator film 130;

perforating an emitter forming region;

depositing a second polysilicon layer by CVD;

introducing arsenic at a dose of about $10^{16}$ into the polysilicon region of the emitter by ion implantation;

introducing arsenic or phosphorus into the polysilicon resistor region at a dose of about $10^{14}$ by ion implantation;

patterning the polysilicon layer;

depositing BPSG by CVD;

providing an opening for contacts;

subjecting the structure to reflow treatment at 900° C. for a duration of 20 minutes to activate the base region and the P$^+$layer; and forming an aluminum connection.

Referring to the nineteenth step of a related art process above for fabricating a semiconductor device, the insulator layer to be perforated for the contacts on a polysilicon layer is a BPSG film merely 600 nm in thickness. This layer is relatively thinner than the other regions in which a 600 nm thick BPSG and a 100 nm thick film from TEOS, i.e., a film with a total thickness, are formed. Accordingly, the insulator layer of the polysilicon layer tend to be more deeply etched than the layer on the other portions. When the etching of contact is performed by an RIE process, for instance, the duration of etching is generally set as such that an additional margin of 50% may be included in the step to thereby obtain a sufficiently wide opening in the transistor region having a 700 nm thick coating. Thus, by a simple calculation:

$$700 \times 1.5 - 600 \approx 450 \text{ nm},$$

an overetching thickness as reduced to an oxide film of about 450 nm may result. Even if an etching rate ratio for polysilicon to SiO$_2$ of 1/10 were to be assured, a polysilicon film from 25 to 70 nm in thickness results from the etching. Then, such a thin polysilicon film is no longer reliable as a contact. The resulting structure of the contact portion A in a polysilicon resistance shown in FIG. 9A is illustrated in further detail in FIG. 9B.

The following three measures are proposed to overcome the aforementioned problem, however, they are not practically feasible because of the attached reasons.

(1) A first measure comprises changing the etching condition as such that the ratio of the etching rate for polysilicon to that for SiO$_2$ may be greater. The etching rate ratio, however, is fundamentally limited so long as the etching is performed using the RIE process. Moreover, such a measure also is problematic because other characteristics which should be controlled are impaired; i.e., problems such as the decrease in etching rate, and the degradation of the contact hole shape newly occur.

(2) A second measure comprises employing other process methods based on chemical reactions, such as plasma etching and solution etching. These methods, however, are for isotropic etching, and are not suited for fine processing.

(3) A third measure comprises thickly forming a polysilicon film for the resistor. This measure, however, fails to realize high resistance.

SUMMARY OF THE INVENTION

An object of the present invention is to provide with less fluctuation, a semiconductor device comprising a high precision MIS capacitor minimally influenced by parasitic capacity, and to provide a process for fabricating the above semiconductor device.

Another object of the present invention is to realize a high performance semiconductor device with higher precision and integration, such as ICs and LSIs. More specifically, the present invention provides a technique for fabricating, without involving additional process steps, MIS and MOS capacitances to be incorporated on the semiconductor devices and having diffusion layers as lower electrodes in a semiconductor substrate, e.g., an Si substrate, without being impaired by unfavorable influences of noises and the like which form attributed to the fluctuation in the substrate potential which occurs due to the substrate current of the MOS digital portion.

A still another object of the present invention is to provide a process for fabricating a semiconductor device having an additional capacitor, for instance, a high performance BiCMOS LSI further equipped with a high performance capacitor, without considerably increasing further process steps. The present invention realizes a semiconductor device such as a high performance BiCMOS LSI yet at a low cost.

A further object of the present invention is to provide a semiconductor device having a resistor formed by a conductor such as polysilicon, in which a contact of thin film high resistivity polysilicon (conductor) resistor is obtained at high reliability by employing a desired process such as a RIE process capable of implementing fine processing. It is also an object of the present invention to provide a reliable process for fabricating the same semiconductor device.

BRIEF DESCRIPTION OF THE DRAWINGS

FIGS. 13A to 13F are step sequence diagrams showing the process for forming a MIS capacitance according to a second embodiment of the present invention;

DETAILED DESCRIPTION OF THE PREFERRED EMBODIMENTS

A first embodiment according to the present invention is described in detail below, referring to attached drawings.

Figure 10:
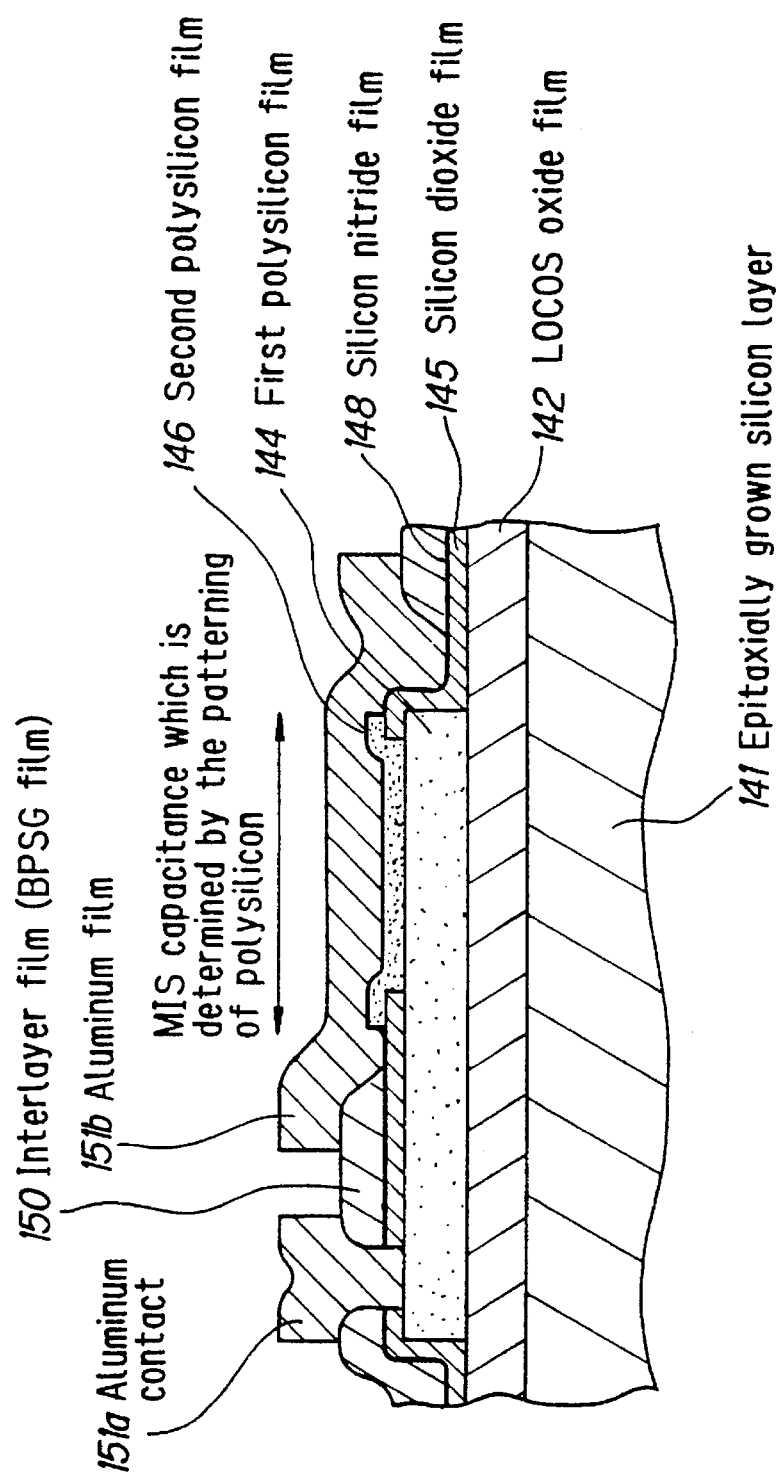
FIG. 10 shows a cross sectional view of a MIS capacitor for a BiCMOS device according to a first embodiment of the present invention.

FIG. 10 is a cross sectional view showing the structure of a MIS capacitor of a BiCMOS device according to an embodiment of the present invention. FIGS. 11A to 11E are step sequence diagrams showing the process for fabricating the MIS capacitance portion shown in FIG. 10.

Referring now to FIG. 10, a MIS capacitor according to the present embodiment comprises a silicon (Si)epitaxial layer 141 having thereon a LOCOS oxide film 142 about 500 nm in thickness, and further thereon a first polysilicon layer 144 about 400 nm in thickness. On the first polysilicon layer 144 are further formed sequentially in this order, about 100 nm thick $SiO_2$ film 145, a second polysilicon film 146 which also functions as an emitter polysilicon, an SiN film 148, an interlayer film (a BPSG film) 150, and an aluminum electrode 151a together with an aluminum film 151b.

The structure according to the present embodiment comprises a 30 nm thick SiN film 148 sandwiched between an aluminum film 151b and a second polysilicon film 146 to form a MIS capacitance. The resulting MIS capacitance depends on the area of the second polysilicon film 146 obtained by patterning. Since the polysilicon film can be obtained by high precision patterning, a high precision MIS capacitance can be obtained as a result. Moreover, the structure comprises a first polysilicon film 144 which functions also as a gate polysilicon as the lead of the electrode.

Figure 11A:
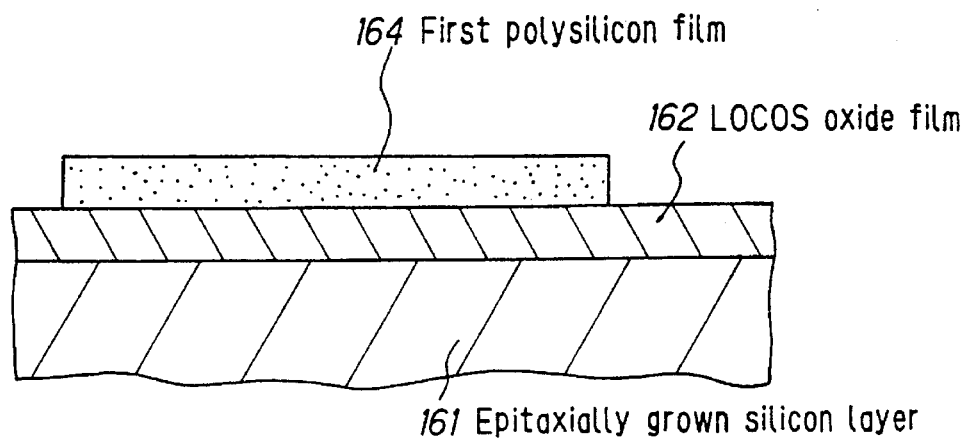
FIGS. 11A to 11E are step sequence diagrams showing the process for forming a MIS capacitance for a BiCMOS device according to a first embodiment of the present invention.
Figure 11B:
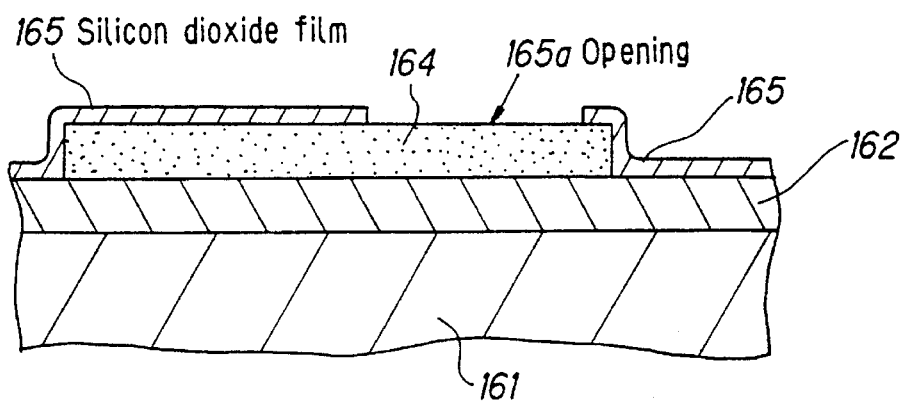

Referring to FIGS. 11A and 11B, the steps for fabricating a MIS structure shown in FIG. 10 according to the present invention are described below. As shown in FIG. 11A, a LOCOS oxide film 162 is deposited on a silicon epitaxial layer 161 for a thickness of several hundreds of nanometers, e.g., for 500 nm. Then, about 400 nm thick polysilicon film is deposited on the LOCOS oxide film 162 by reduced pressure CVD, and a first polysilicon film 164 is deposited thereon by etching using an RIE process. The first polysilicon film 164 is highly doped with phosphorus (P).

Referring to FIG. 11B, about 100 nm thick $SiO_2$ film 165 is deposited by decomposing TEOS (tetraethyloxysilane), and an opening 165a is formed therein at the portion for forming an emitter contact.

Figure 11C:
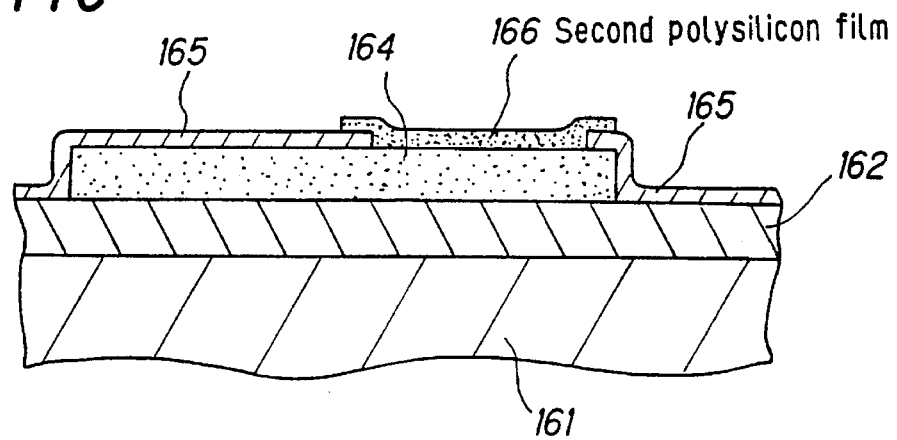

Then, as shown in FIG. 11C, about 100 nm thick polysilicon film is deposited over the entire surface by reduced pressure CVD, and a second polysilicon film 166 which also functions as a polysilicon emitter is formed by etching using an RIE process in such a manner that the opening 165a may be buried. The MIS capacitance of the present embodiment substantially depends on the area of the second polysilicon film 166 thus obtained by patterning using RIE. A desired pattern can be obtained with high precision by using the RIE patterning process.

Figure 11D:
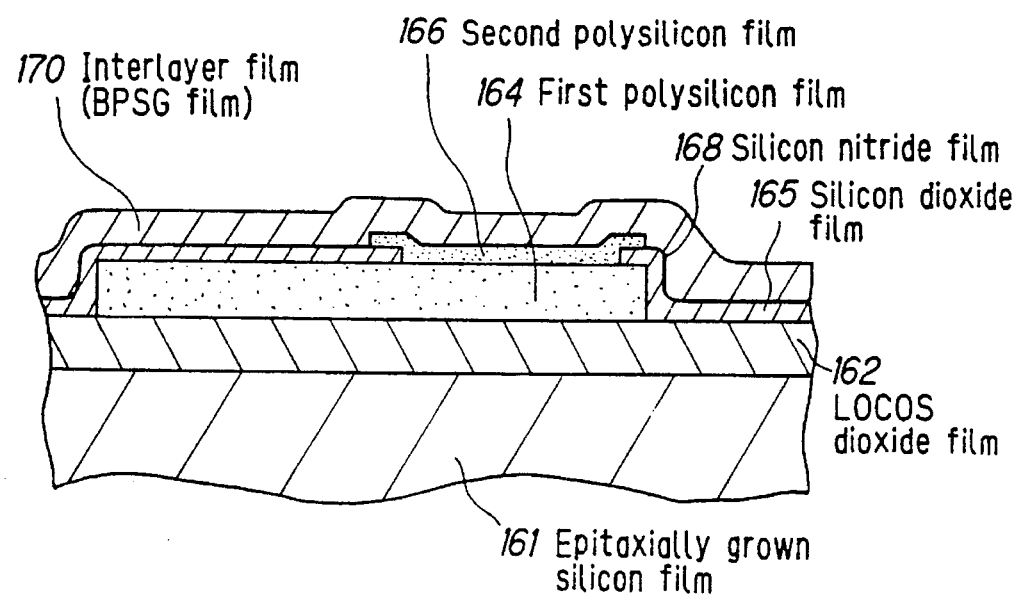

Referring now to FIG. 11D, an SiN film 168 is deposited as an insulator on the MIS capacitor over the entire surface to a thickness of about 30 nm. About 600 nm thick BPSG interlayer film 170 is further deposited thereon by CVD.

Figure 11E:
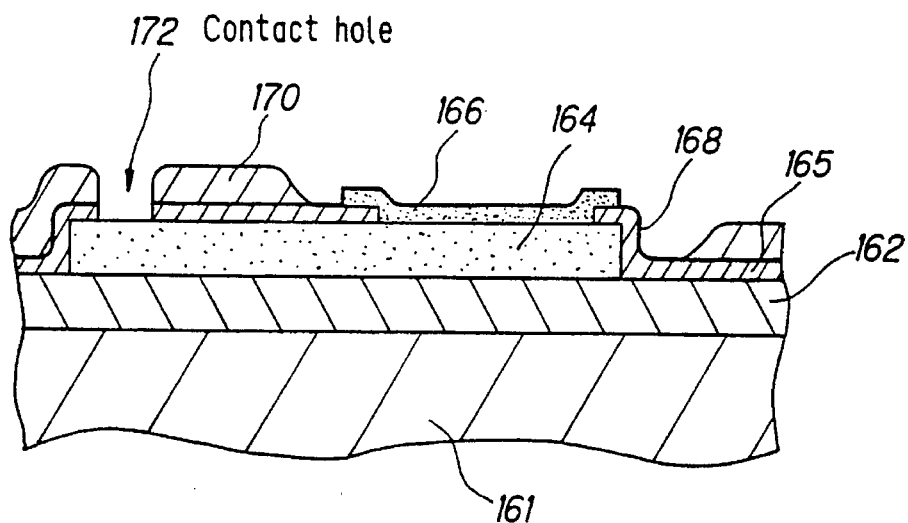

As shown in FIG. 11(E), a contact hole 172 is formed in the BPSG film by RIE to allow contact with aluminum. This step is followed by forming a window by wet etching after reflow treatment of the BPSG film to form a MIS capacitance. RIE process is unsuitable for the formation of a window in this case because the underlayer under PBSG is made of SiN.

A MIS capacitor in a BiCMOS structure as shown in FIG. 10 is thus implemented by patterning an aluminum film deposited by sputtering to form an aluminum electrode 151a and an aluminum film 151b for the MIS capacitance portion.

As described in the foregoing, the MIS capacitance according to the present invention is obtained on a thick oxide film formed by LOCOS and the like. Moreover, since a dry etching process such as RIE (reactive ion etching) is used to determine the area of the oxide film, a MIS capacitance with minimized fluctuation and least influenced by parasitic capacitance can be obtained.

Furthermore, since a gate polysilicon highly doped with impurities such as phosphorus is used as a material for the contact portion of the electrode, the parasitic capacitance within the structure can be suppressed low. Accordingly, degradation in frequency characteristics can be also suppressed.

Moreover, the boundary between the emitter polysilicon and the insulator layer can be formed without causing damage due to RIE and the like.

A MIS capacitance for a BiCMOS LSI according to a second embodiment of the present invention is described below.

Figure 12:
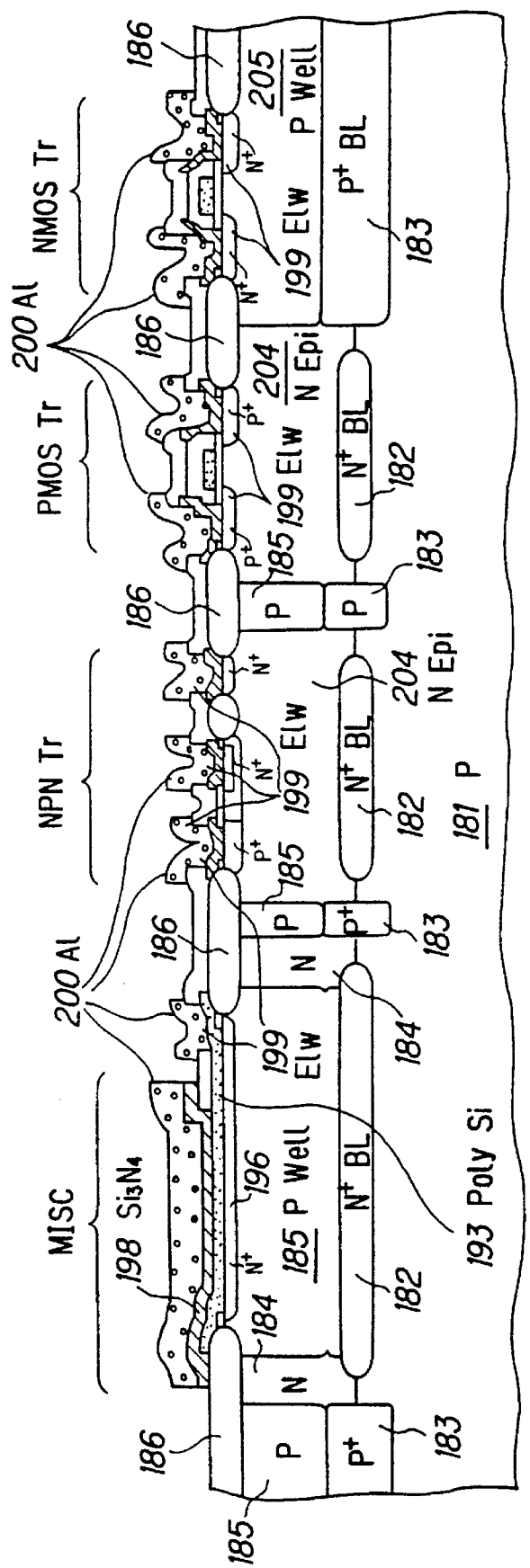
FIG. 12 shows a cross sectional view of a MIS capacitor according to a second embodiment of the present invention.

FIG. 12 is a cross sectional view of a MIS capacitor according to the present embodiment. The process steps are described referring to step sequence diagrams shown in FIGS. 13A to 13F.

Referring now to FIG. 13A, a 10-Ω·cm P type silicon substrate 211 comprises an N type BL (buried layer) 212, a P type BL, a 1-Ω·cm N type epitaxial layer 214, a P type well layer 215 which is connected to the P type BL 213 to function as an isolation. A 0.5 μm thick LOCOS oxide film 216 and a base layer 217 for an NPN transistor are formed on the substrate. These structures are formed by a known process. It should be noted that the region for forming a MIS capacitance MISC comprises a P type well layer surrounded by an N type epitaxial layer 214 and an N type BL 212.

Figure 13B:
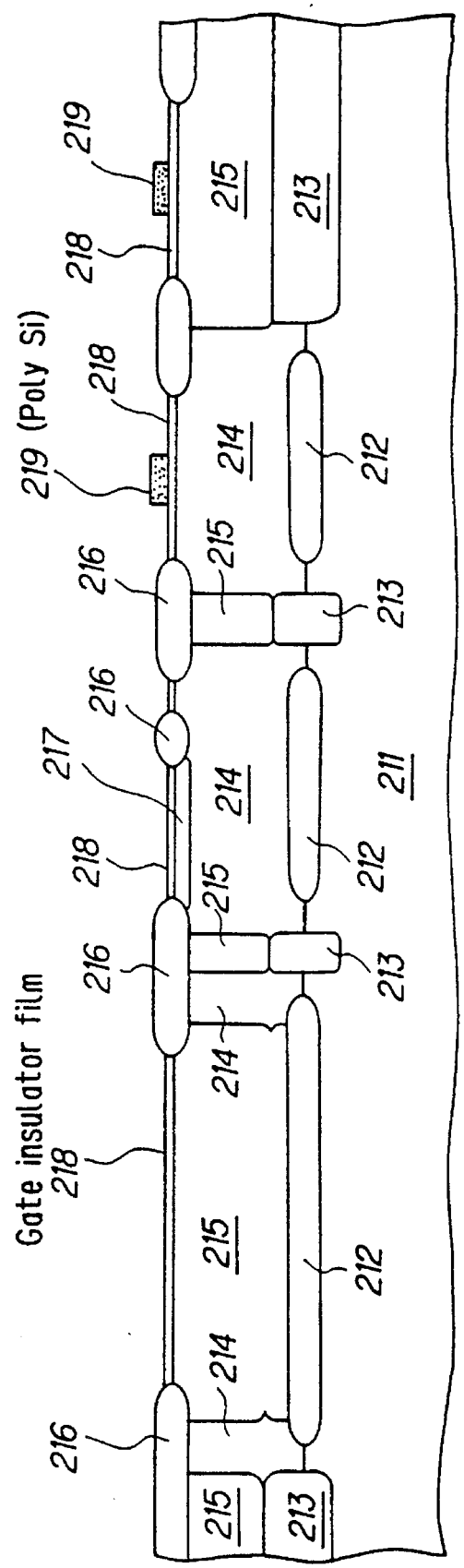

In the step shown in FIG. 13B, a 30 nm thick gate insulator film (oxide film) 218 is formed by oxidation. Then, polysilicon film is deposited by CVD under reduced pressure, and phosphorus is incorporated therein by a desired method, for example, doping under a $POCl_3$ atmosphere, diffusion from PSG, and ion implantation. The resulting film is perforated to provide a window for the MOS gate, followed by RIE etching to form a gate material 219 for the MOS gate.

Figure 13C:
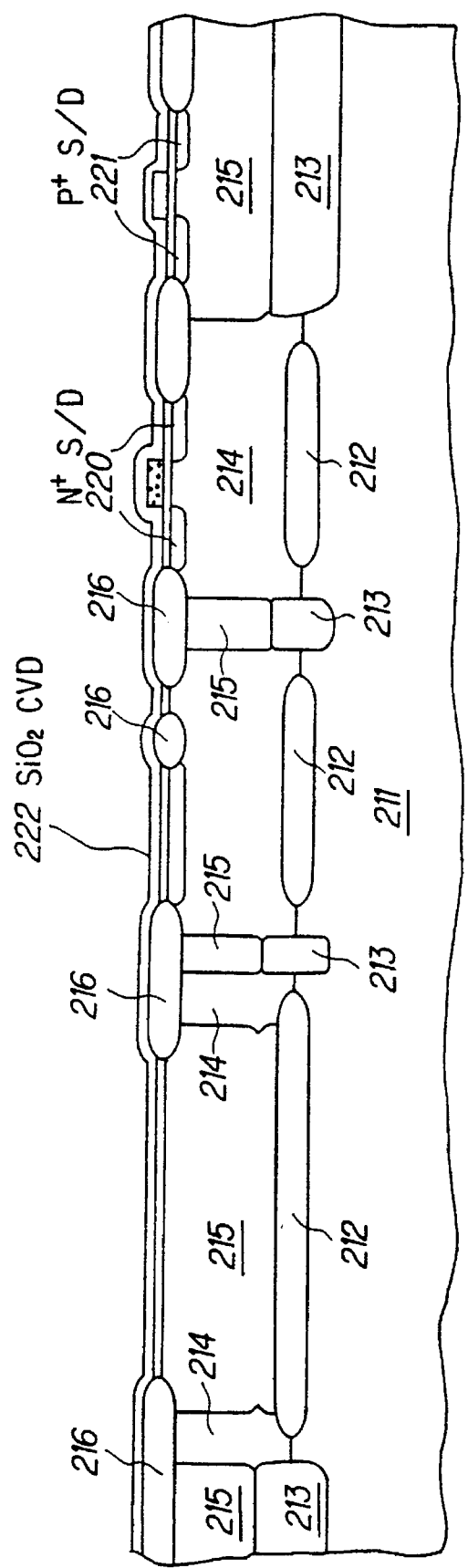

Referring to FIG. 13C, ion implantation is performed to dope S/D (source/drain) regions of the NMOS transistor with phosphorus and S/D regions of the PMOS transistor with boron to form an $N^+$source/drain 220 and a $P^+$source/drain 221, respectively. This is followed by deposition of a 200 nm thick $SiO_2$ film 222 using a normal pressure CVD.

In the following FIG. 13D step, windows are opened by a photoresist process to provide the contacts for a lower electrode of MIS capacitor MISC, emitter, base, and collector of an NPN transistor, and S/D for the NMOS and PMOS transistors. Then, a 10 nm thick polysilicon film is deposited by reduced pressure CVD, and subjected to photoresist and RIE processes to leave over the polysilicon film on the aforementioned contact portions to obtain a second polysilicon layer 223. Then, ion implantation is performed to introduce, though not shown in the figure, phosphorus in the contacts of the MIS capacitor, emitter, collector, and S/D of the NMOS transistor, and boron into the contacts of base and S/D of the PMOS transistor.

In the FIG. 13E step, a 100 nm thick $SiO_2$ film 224 is deposited by either a normal pressure or reduced pressure CVD, and annealed at 950° C. for 15 minutes to form a P type layer 225 and an N type layer 226. Then, photoresist and RIE processes are performed to form a MIS (well) 227.

Figure 13D:
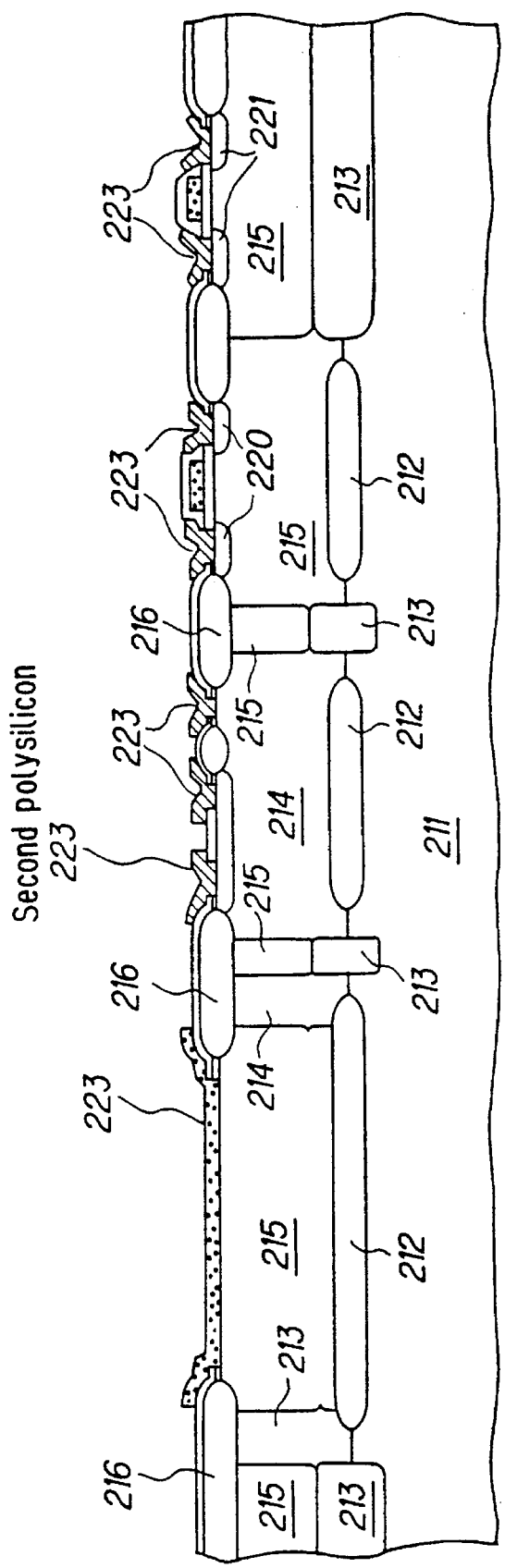
Figure 13F:
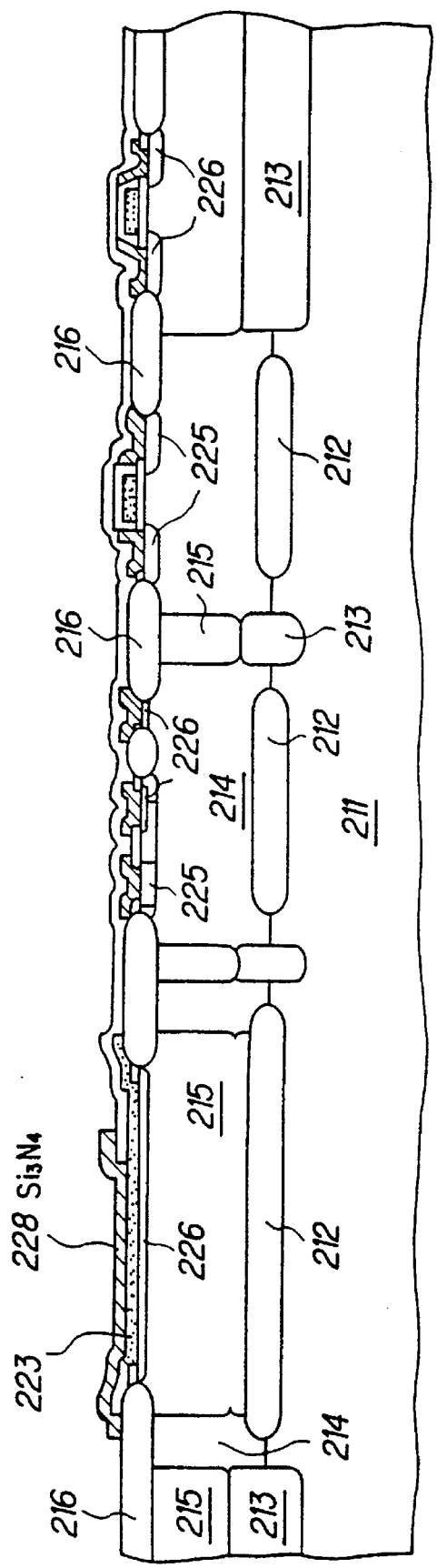

Referring to FIG. 13F, an $Si_3N_4$ film is deposited for a thickness of from 35 to 50 nm by reduced pressure CVD to provide a dielectric film 228. The $Si_3N_4$ film is then partially removed by photoresist and RIE processes to leave over the film only on MIS capacitor MISC portion. Thus is obtained a dielectric film 228.

Figure 1A:
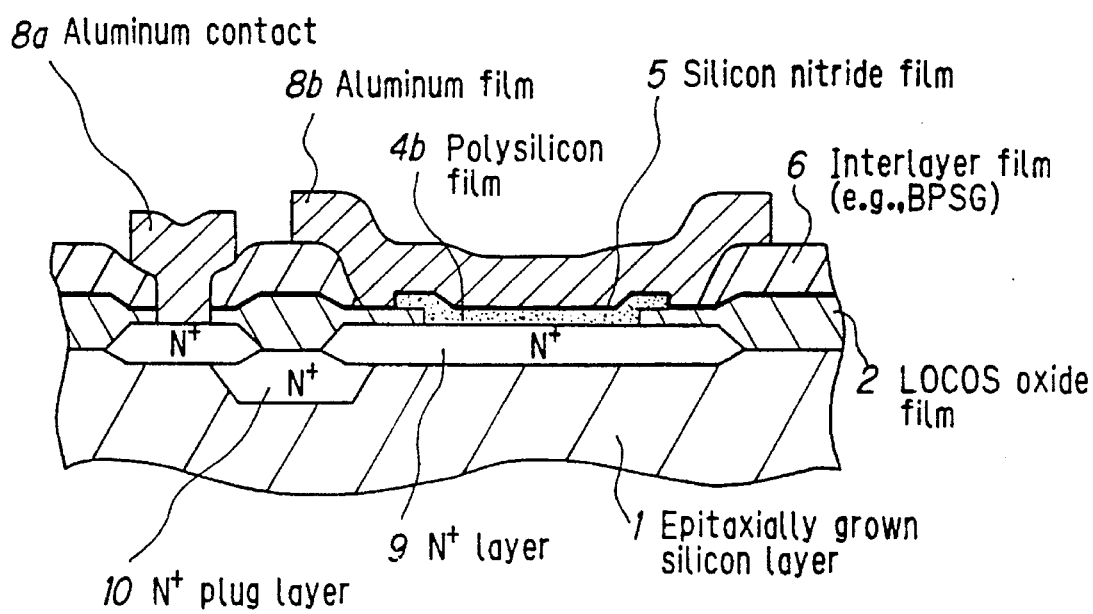
FIGS. 1A and 1B shows a cross sectional view of a MIS capacitor according to related art.
Figure 1B:
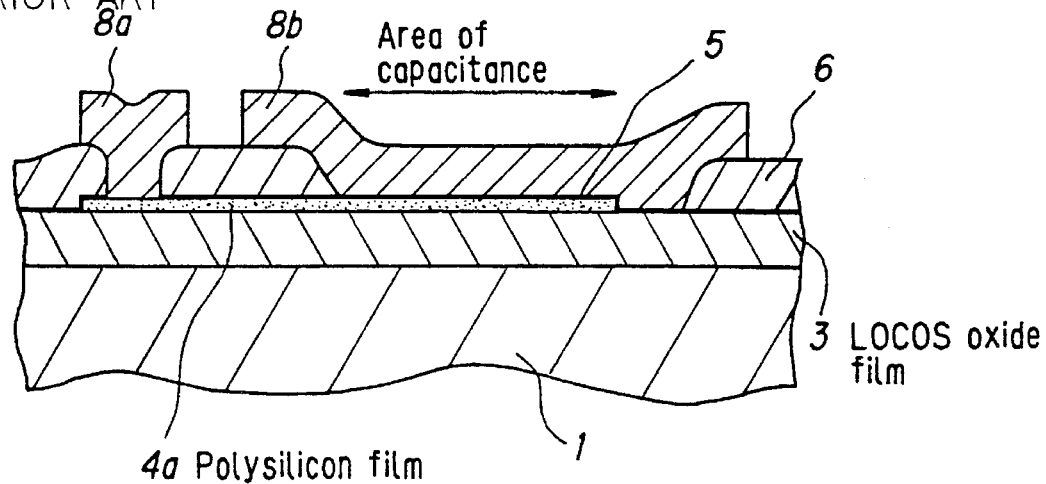

Then, electrode windows 229 are formed in the S/D portions of the MIS capacitor MISC, NPN transistor, PMOS and NMOS transistors by photoresist and RIE processes. Thus is obtained a semiconductor device as shown in FIG. 1 by finally forming aluminum electrodes.

In the description above, the S/D regions 220 and 221 shown in FIG. 13C are formed separately from the formation of the contact portions shown in FIG. 13D, however, the formation of the S/D regions may be omitted in some cases.

In the structure according to the present embodiment, the N type region for forming the MIS capacitor MISC, which also functions as the emitter of the NPN transistor, forms a PN junction in combination with the P type well layer 215, and is further surrounded by another PN junction composed of a P type well layer 215 and an N type epitaxial layer 214 and N type BL 212. Thus, the structure can be completely shielded and isolated from noises by connecting the N type BL 212 to a stable earth terminal.

A device according to a third embodiment of the present invention is described below.

Figure 14:
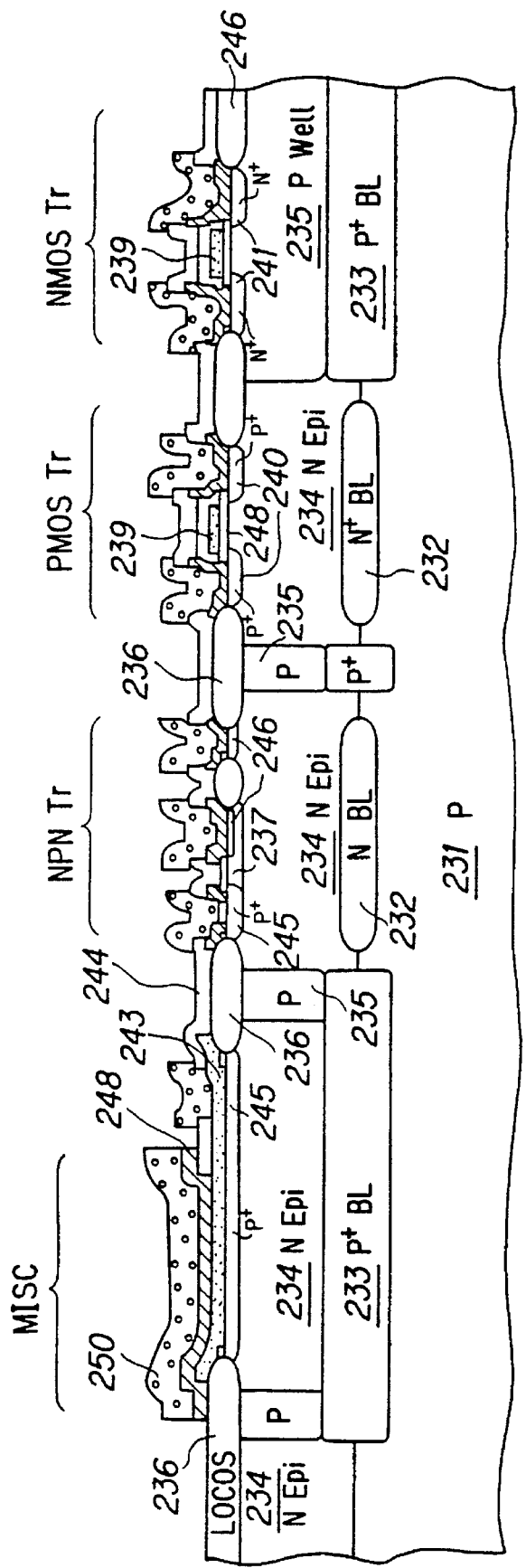
FIG. 14 shows a cross sectional view of a MIS capacitor according to a third embodiment of the present invention.

FIG. 14 shows the final structure of the device. This structure according to the third embodiment differs from the aforementioned device according to the second embodiment in that the MIS capacitance of the device according to the third embodiment is formed on an NPN transistor graft base (P type), and that it is isolated by a PN junction formed from an N type epitaxial layer with a P type BL and a P type well.

Favorable MIS capacitors MISCs having an electrically shielded structure can be realized by both the second and third embodiments without adding any steps in the process for fabricating a BiCMOS LSI having a twin BL structure.

As described in the foregoing, a MIS or MOS capacitor to be assembled in an IC or LSI and having a diffusion layer inside a semiconductor substrate (e.g., a Si substrate) as a lower electrode can be obtained without being unfavorably influenced by noises attributed to the fluctuation of substrate potential which may arise by the substrate current and the like of a MOS digital portion. Thus, a high performance semiconductor device such as an IC and an LSI with higher precision and integration can be implemented by the present embodiment without incorporating additional process steps.

A fourth embodiment according to the present invention is described below referring to FIGS. 15A and 15D.

FIGS. 15A to 15D show a cross sectional view of a MIS capacitor T1 and a P channel MOS transistor T2 established on the upper portion of a silicon semiconductor. The structure of the bipolar transistor is omitted because it is the same as a one of a related art.

Figure 15A:
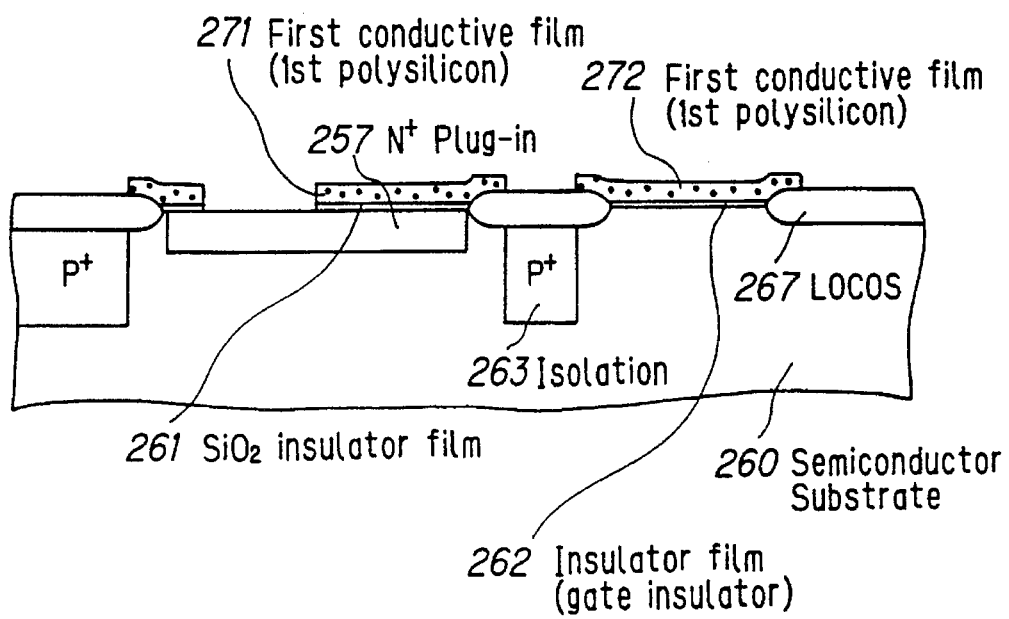
FIGS. 15A to 15D are step sequence diagrams showing the process for forming a MIS capacitance for a BiCMOS device according to a fourth embodiment of the present invention.
Figure 15B:
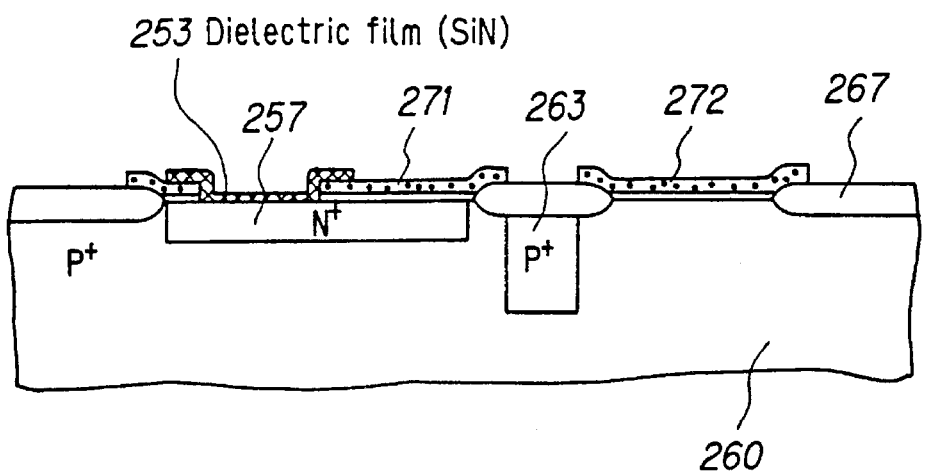
Figure 15C:
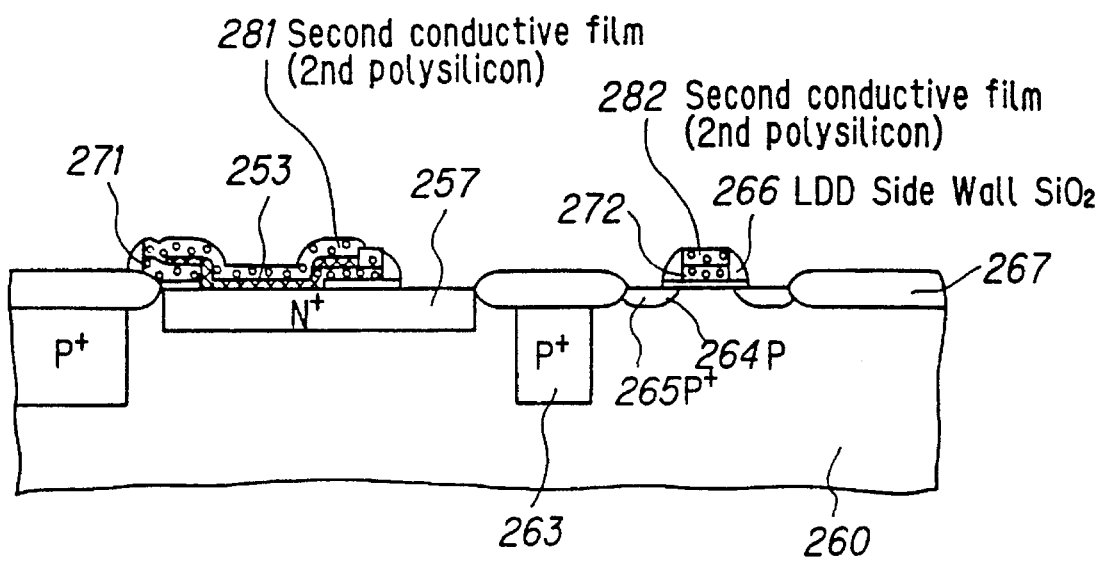

The BiCMOS transistor according to the present embodiment can be fabricated by a process comprising:

forming insulator films (to provide insulator films 261 and 262) on a semiconductor substrate 260;

forming a first electrically conductive film (to provide electrically conductive films 271 and 272);

processing the insulator film and the first electrically conductive film into a layered structure (see FIG. 15A);

forming a dielectric film 253 (see FIG. 15B);

forming a second electrically conductive film (to provide electrically conductive films 281 and 282); and processing the above insulator films and the first and second electrically conductive films into a layered structure (see FIG. 15C). Additional steps of forming an insulator film 255 and providing an opening in the insulator film to form a contact hole for the connection (see FIG. 15D) are further incorporated in the process according to the present embodiment.

The process according to the present embodiment is described in further detail below. Referring first to FIG. 15A, a buried N$^+$layer 257 and a diffusion layer are formed in the bipolar transistor portion. The buried layer 257 and the diffusion layer function as a contact for collector of a PNP transistor (not shown in the figure).

After forming a 400 to 500 nm thick LOCOS oxide film 267 and a P$^+$diffusion layer 263 for element isolation, an insulator film is formed and patterned to give a 10 to 20 nm thick insulator film 262 as a gate oxide film.

A polysilicon electrically conductive layer from about 100 to 200 nm in thickness is then deposited over the entire surface of the resulting structure by CVD to provide first electrically conductive films 271 and 272. Openings corresponding to the capacitor forming region and the base and emitter forming portions (not shown in the figure) for bipolar transistor region are then perforated in the layered polysilicon/gate oxide film by a known dry etching technology.

The polysilicon film in this case functions as a protective film for the gate oxide film during the formation of the opening. Hence, the polysilicon film prevents failure of, for example, withstand voltage due to pollution of the gate oxide film from occurring in the step of resist removal during the formation of the opening in the gate oxide film.

In the FIG. 15B step, a 30 to 60 nm thick SiN film is deposited by CVD and processed by a known dry etching technology to leave SiN over the MIS capacitor forming region to provide a dielectric film 253.

Referring to FIG. 15C, a 100 to 200 nm thick polysilicon layer is then deposited by CVD as a second electrically conductive film. This layer together with the previously CVD-deposited polysilicon film gives a polysilicon film 300 to 400 nm in total thickness.

Subsequently, N$^+$ions are ion-implanted into the area corresponding to the gate contact region of the MOS transistor portion. After ion-implanting P$^+$ions into the base contact forming region of the bipolar transistor portion, the layered polysilicon layer above is processed by a conventional dry etching technology except for the capacitor electrode, the gate electrode of the MOS transistor portion and the base electrode (not shown in the figure) of the bipolar transistor portion. Then, ion-implantation of P$^+$ions is performed to form an LDD diffusion layer 264 in the MOS transistor portion.

A 200 to 400 nm thick SiO$_2$ film is deposited by CVD and then anisotropically etched by a known dry etching technology to form an SiO$_2$ spacer 266 for the LDD.

The base and emitter forming regions of the bipolar transistor can be protected from being overetched because they are covered with polysilicon during the anisotropic etching for forming the SiO$_2$ spacer for the LDD (not shown in the figure).

The MOS transistor portion is then subjected to ion-implantation of P$^+$ions to form a source and drain diffusion layer 265.

Figure 15D:
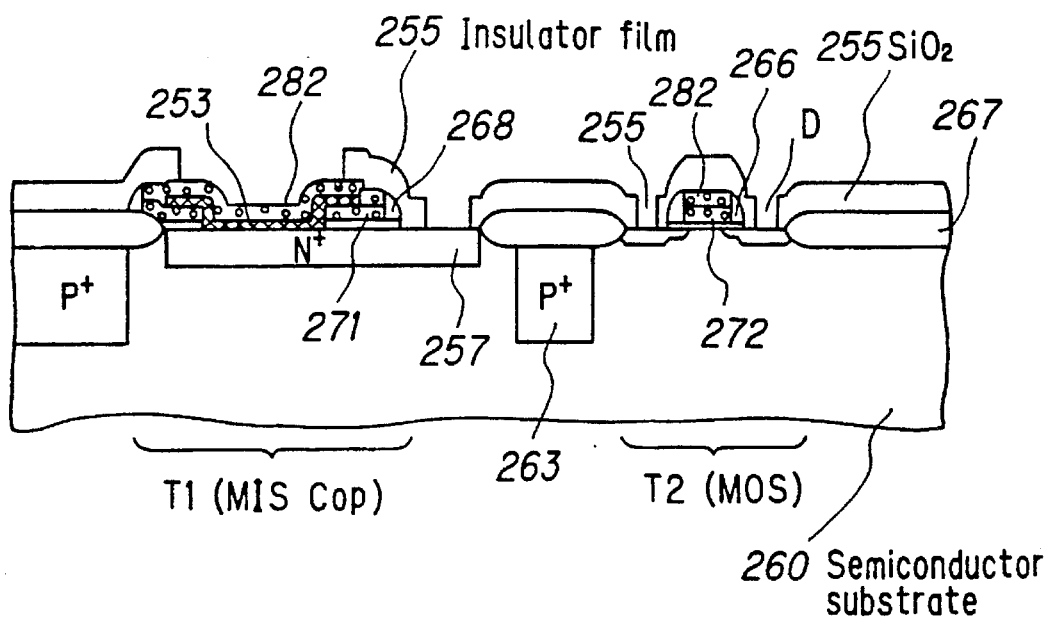

Referring to FIG. 15D, a 300 to 400 nm thick SiO$_2$ is deposited by CVD, and the layered SiO$_2$/polysilicon film on the base and emitter forming regions of the bipolar transistor is removed by a known dry etching technology.

An SiO$_2$ film is deposited to a thickness of from 400 to 600 nm by CVD, and subjected to anisotropic etching by a known dry etching process to form an SiO$_2$ spacer 268 for the isolation of emitter and base electrodes.

A polysilicon film for forming an emitter is deposited by CVD, and processed by a known dry etching technology. A base and an emitter are then formed by ion implantation and diffusion of ions into said polysilicon film.

P$^+$ions are diffused from the base contact to form a graft base at the same time the source and drain diffusion layers of the MOS transistor are activated by a heat treatment. The process steps for forming the element are essentially the same as those explained in the process of a prior art technology.

After depositing a 300 to 400 nm thick SiO$_2$ film by CVD to establish an insulator film 255, each of the electrodes (not shown in the figure) is formed by a known interconnection technology.

The capacitor electrode portion in this embodiment differs from that of a prior art structure. The capacitor electrode portion is covered by a polysilicon film and is thereby protected against anisotropic etching during the formation of the windows for the electrodes. Accordingly, this electrode portion can be formed simultaneously with the other electrodes.

As described in the foregoing, the process according to the present embodiment enables addition of a high precision capacitor on a BiCMOS LSI, and it comprises:

(1) forming the capacitor forming regions simultaneously with the formation of the active region of the bipolar transistor; and (2) utilizing the contact of a capacitor also as an electrically conductive film, such as a polysilicon film, for forming a gate electrode, and covering the insulator film for the capacitor with said polysilicon film or the like. In this manner, the insulator film of the capacitor can be avoided from being etched during the anisotropic etching for forming a window for the electrode.

It can be seen that the present embodiment provides a means for adding a high precision capacitor as mentioned in the foregoing without considerably adding or modifying the conventional process steps.

Thus, the present embodiment provides a process for fabricating a semiconductor device added thereto a capacitor; particularly, for example, a device comprising a high performance BiCMOS LSI and added thereto a high performance capacitor, without considerably involving additional steps in the conventional process. Accordingly, the present embodiment realizes a semiconductor device such as a high performance BiCMOS LSI yet at a low cost.

A fifth embodiment according to the present invention is described below referring to FIG. 16A.

Figure 16A:
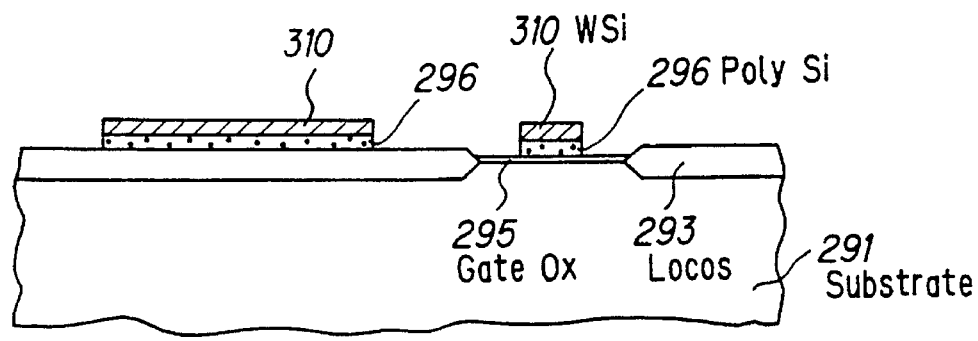
FIGS. 16A to 16C are step sequence diagrams showing the process for fabricating a MIS capacitor according to a fifth embodiment of the present invention.

FIG. 16A shows the cross sectional view of the upper portion of a silicon substrate comprising a MIS capacitor and a channel MOS transistor portion. The portion for a bipolar transistor is omitted because it is the same as that of a prior art structure.

Referring to FIG. 16A, a buried $N^+$layer and a diffusion layer are formed in the bipolar transistor portion. The buried layer and the diffusion layer function as a contact for a collector of an NPN transistor (not shown in the figure). After forming a 400 to 500 nm thick LOCOS oxide film 293 and a $P^+$diffusion layer 295 for element isolation, an insulator film is formed and patterned to give a 10 to 20 nm thick insulator film 295 as a gate oxide film. A polysilicon layer from about 100 to 200 nm in thickness is then deposited over the entire surface of the resulting structure by CVD, and openings corresponding to the base forming region and the emitter forming portions for the bipolar transistor region are then perforated in the layered polysilicon 296/gate oxide film 295 by a known dry etching technology. The polysilicon film 296 in this case functions as a protective film 295 for the gate oxide film during the formation of the opening. Hence, the polysilicon film prevents failure of, for example, withstand voltage due to pollution of the gate oxide film from occurring in the step of resist removal during the formation of the opening in the gate oxide film 295.

Then, a 100 to 200 nm thick polysilicon layer is deposited by CVD. This layer together with the previously CVD-deposited polysilicon film gives a polysilicon film 300 to 400 nm in total thickness.

Subsequently, if necessary, a film 310 of a silicide of a refractory metal such as tungsten (W) is deposited for a thickness of from about 100 to 200 nm over the entire surface by CVD. The silicide film lowers the resistance of the gate electrode.

$N^+$ions are ion-implanted into the area corresponding to the gate electrode region of the MOS transistor portion. After ion-implanting $P^+$ions into the base contact forming region of the bipolar transistor portion, the polysilicon layer 296 or the layered polysilicon 296/silicide 310 above is processed by a conventional dry etching technology except for the lower electrode of the capacitor, the gate electrode of the MOS transistor portion, and the base electrode (not shown in the figure) of the bipolar transistor portion.

Figure 16B:
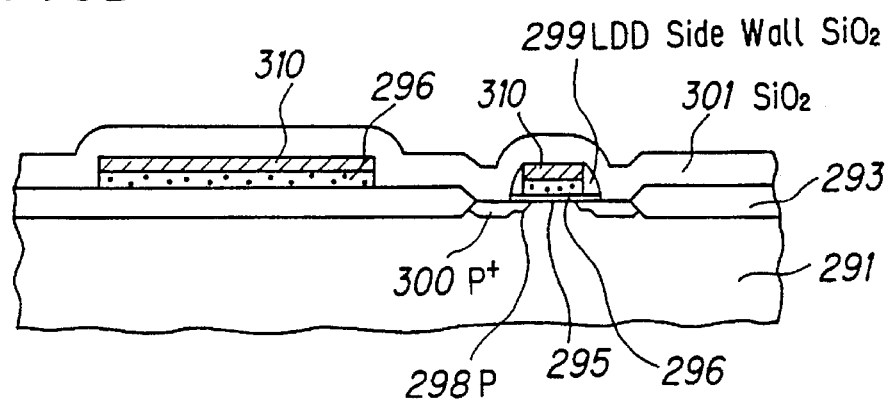

Referring to FIG. 16B, ion-implantation of $P^-$ ions is performed to form an LDD diffusion layer 298 in the MOS transistor portion. A 200 to 400 nm thick $SiO_2$ film is deposited by CVD and then anisotropically etched by a known dry etching technology to form an $SiO_2$ spacer 299 for the LDD.

The MOS transistor portion is then subjected to ion-implantation of $P^+$ions to form a source and a drain diffusion layer 300.

After depositing a 300 to 400 nm thick $SiO_2$ 301, the layered $SiO_2$/polysilicon film of the base and emitter forming regions of the bipolar transistor is removed by a known dry etching technology.

An $SiO_2$ film is deposited to a thickness of from 400 to 600 nm by CVD, and subjected to anisotropic etching by a known dry etching process to form an $SiO_2$ spacer for the isolation of emitter and base electrodes.

Figure 16C:
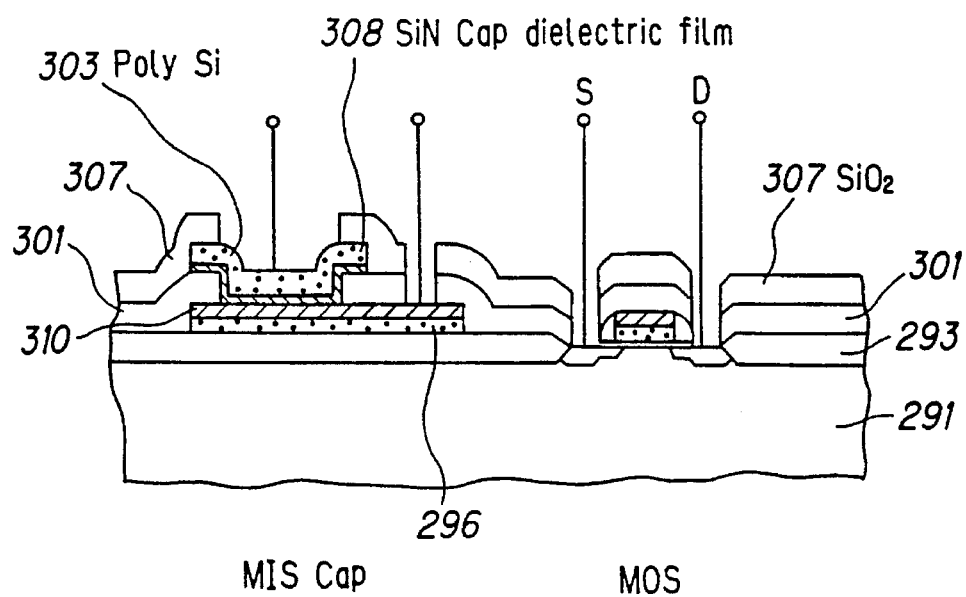

Referring to FIG. 16C, the $SiO_2$ film 301 of the capacitor forming region is subjected to known lithography and dry etching processes to form an opening. Then, a 30 to 60 nm thick SiN coating is formed and processed by a conventional dry etching technology to leave over an SiN film 308 the MIS capacitor forming portion.

A polysilicon film 303 for forming an emitter is deposited by CVD, and processed by a known dry etching technology. This polysilicon film 303 functions as an emitter electrode of the bipolar transistor portion as well as an upper electrode of the capacitor portion.

Base and emitter are then formed by ion implantation and diffusion of ions into said polysilicon film. $P^+$ions are diffused from the base contact to form a graft base at the same time the source and drain diffusion layers of the MOS transistor are activated by the heat treatment performed at this time.

After depositing a 300 to 400 nm thick $SiO_2$ film by CVD, each of the electrodes (not shown in the figure) is formed by a known interconnection technology. Since the capacitor electrode portion is covered by the polysilicon film 303, the SiN layer is thereby protected against anisotropic etching during the formation of the windows for the electrodes. Accordingly, this electrode portion can be formed simultaneously with the other electrodes.

In the present embodiment, the capacitor dielectric is directly deposited by CVD on a polysilicon film or a layered polysilicon/silicide structure (see FIG. 16B). However, this process may suffer the following problems:

(1) The surface irregularities of the capacitor lower electrode causes the capacitance to fluctuate; and (2) The deposition of the capacitor dielectric on the silicide layer may cause the silicide layer to undergo separation due to the thermal stress which generates during the film deposition.

As a means for overcoming the aforementioned problems, the following two are proposed:

(1) Smoothing the lower electrode by polishing or a like means before depositing the capacitor dielectric; and (2) Depositing an electrically conductive film at a low temperature to cover the silicide film before depositing the capacitor dielectric.

Considering the second countermeasure to the problems, particularly preferred is to deposit an amorphous silicon film as the electrically conductive film. The use of an amorphous silicon film is advantageous, because it not only enables a low temperature process but also suppresses the formation of surface irregularities.

As a matter of course, the above electrically conductive film may be used also as a base contact of the bipolar transistor portion or the emitter contact depending on the process.

The present embodiment according to the present invention provides, when adding a high precision capacitor to a BiCMOS LSI, the following effects:

(1) A high performance BiCMOS LSI having a capacitor is obtained at low cost, by utilizing an electrically conductive film formed on an insulator film not only as the lower electrode of the capacitor, but also as a polysilicon film and the like used for forming the gate electrode of the MOS transistor;

(2) The contact of the capacitor is allowed to form without involving any additional steps to the conventional process, by utilizing it also as the polysilicon and the like for forming base and emitter electrodes of the bipolar transistor; furthermore, the capacitor contact is also allowed to form at the same time with the formation of other electrodes, because, by coating the capacitor insulator film with said polysilicon film, the capacitor insulator film can be protected from being etched during the anisotropic etching for forming windows of the electrodes; and (3) The fluctuation in capacitance is reduced by decreasing surface irregularities of the lower electrode of the capacitor.

Conclusively, the present embodiment according to the present invention provides a process for fabricating a high performance BiCMOS LSI or a like device at low cost by adding a capacitor to the high performance BiCMOS LSI without considerably increasing additional steps in the conventional process.

A sixth embodiment according to the present invention is described below referring to FIG. 17.

Figure 17:
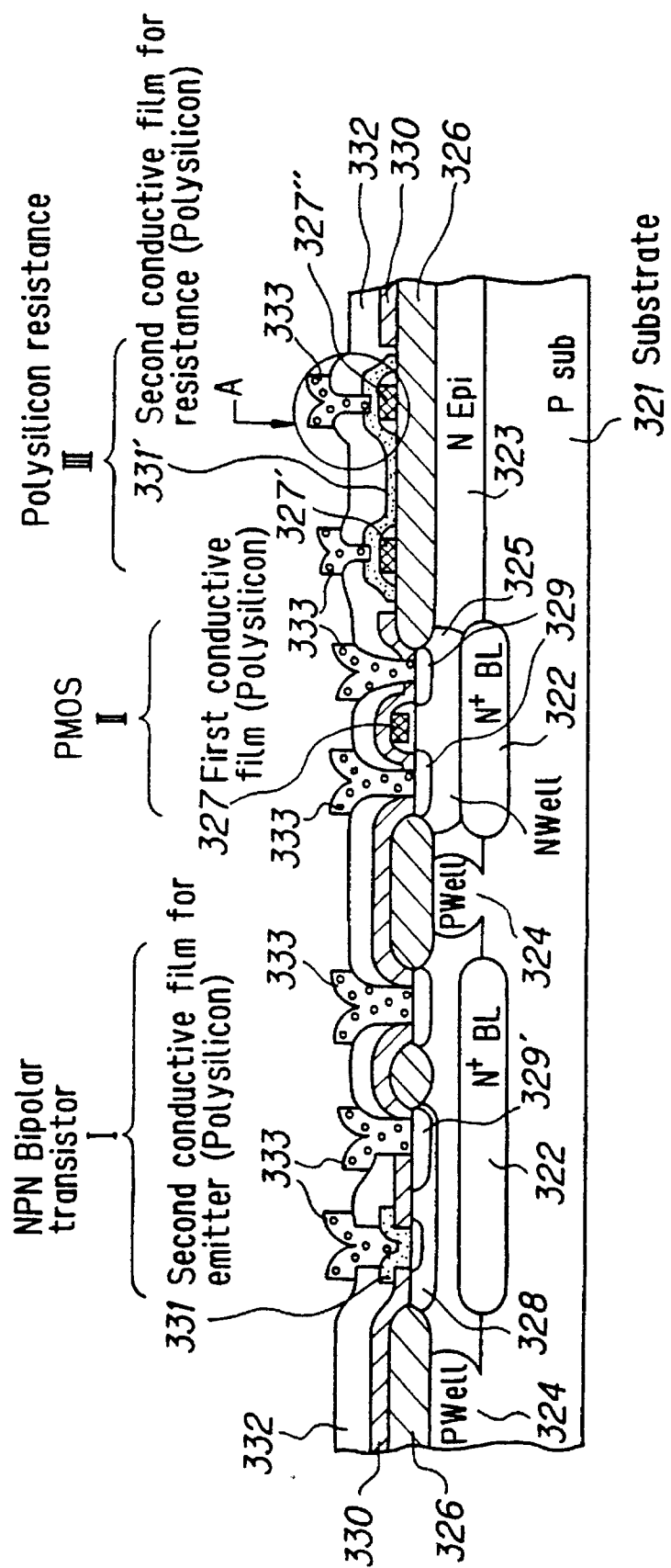
FIG. 17 shows schematically a cross sectional view of the structure of a BiCMOS device according to a sixth embodiment of the present invention.
Figure 18:
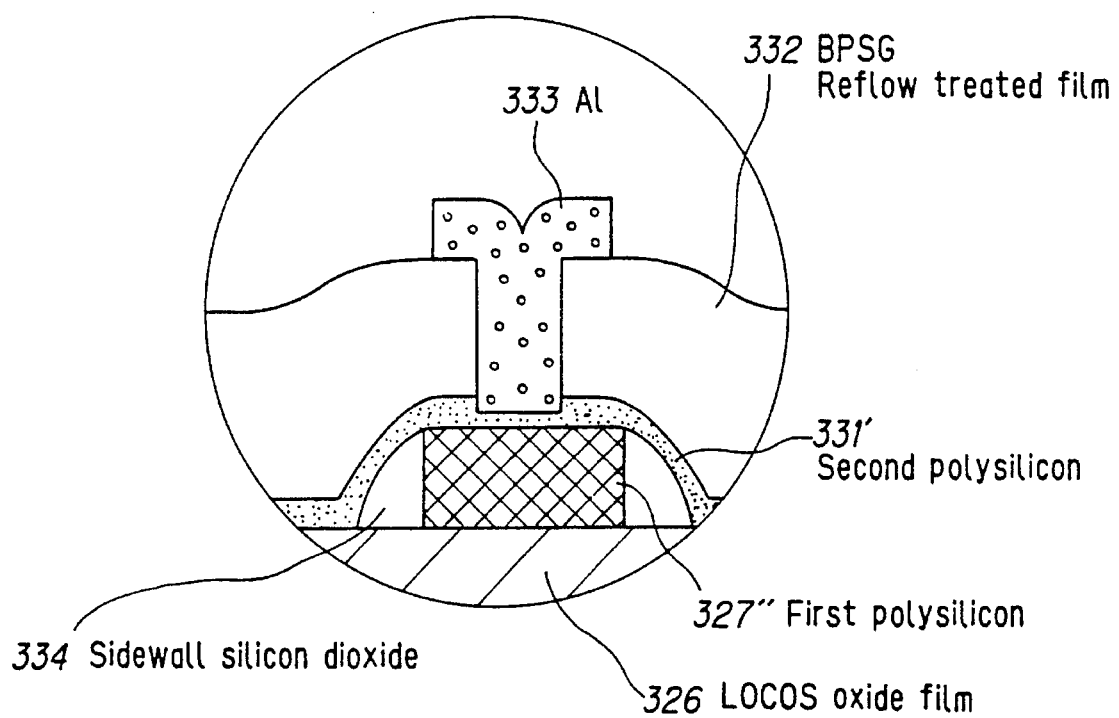
FIG. 18 shows an enlarged cross sectional view of a part shown in the structure of FIG. 17 according to a sixth embodiment of the present invention.

FIG. 17 shows a cross sectional view of a BiCMOS semiconductor device according to an embodiment of the present invention. Referring to FIG. 17, the BiCMOS semiconductor device comprises a bipolar transistor (an NPN transistor in the present case) I, a MOS transistor (a PMOS transistor in the present case) II, and a resistor III formed by an arbitrary conductor film (a polysilicon film 331' in the present case). The device comprises an arbitrary conductor film (a polysilicon film in this case) 331 as the impurity source for forming an emitter of the bipolar transistor I and as the emitter contact, and the same layer also provides a conductor film 331' for the above resistor III. The device further comprises an arbitrary conductor film (a polysilicon film in this case) 327' as the gate of the above MOS transistor II, and the same layer provides a conductor film (also a polysilicon film) 327" formed on the contact electrode region of the aforementioned resistor III.

Figure 19A:
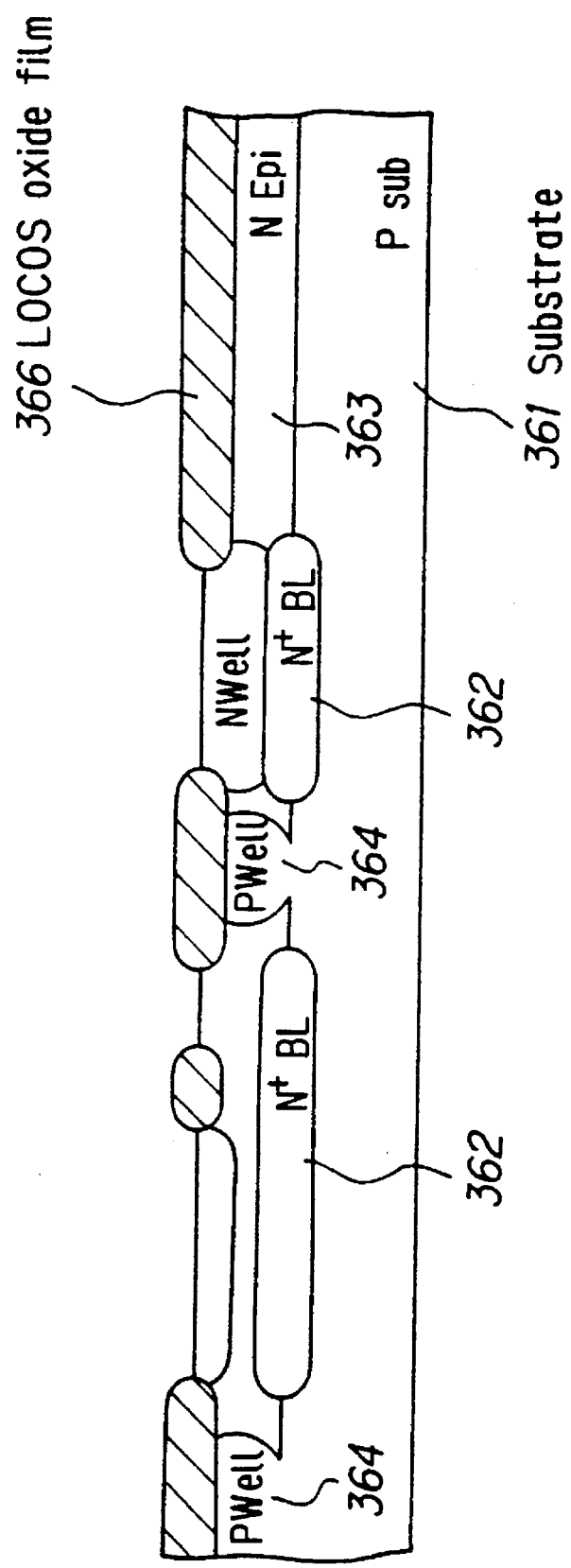
FIGS. 19A to 19C are step sequence diagrams showing the process for fabricating a BiCMOS device according to a seventh and eighth embodiment of the present invention.
Figure 19B:
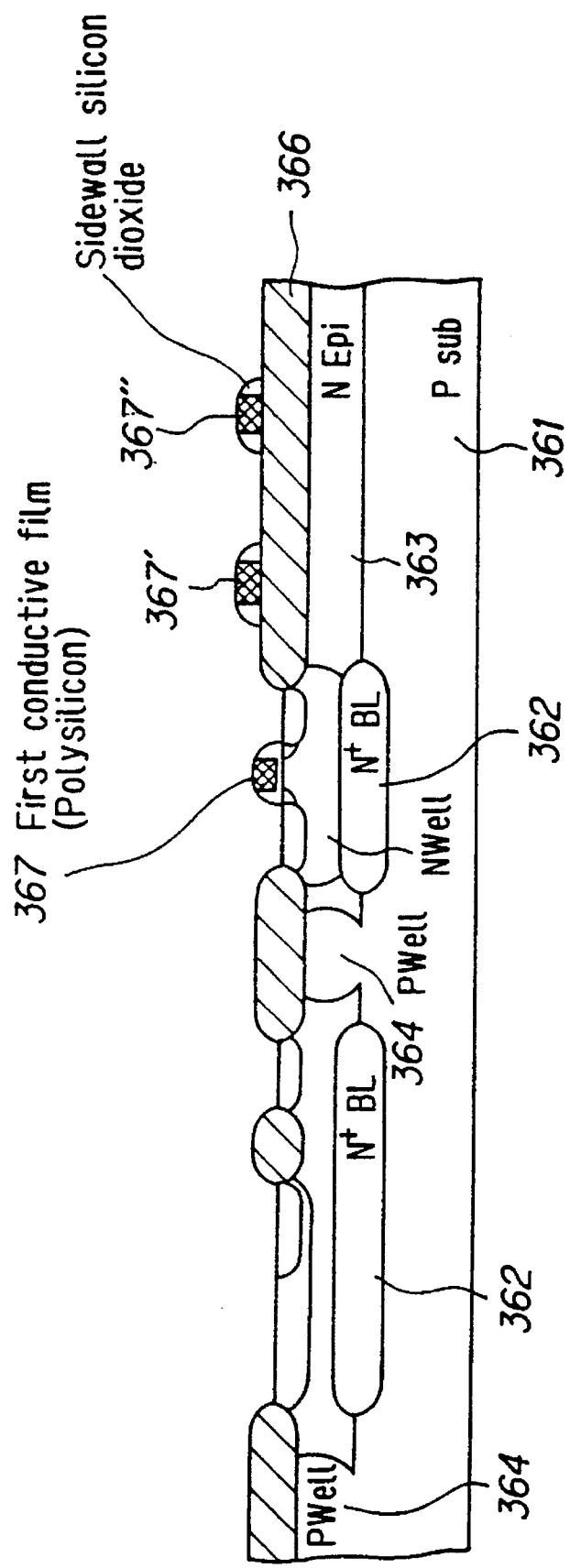
Figure 19C:
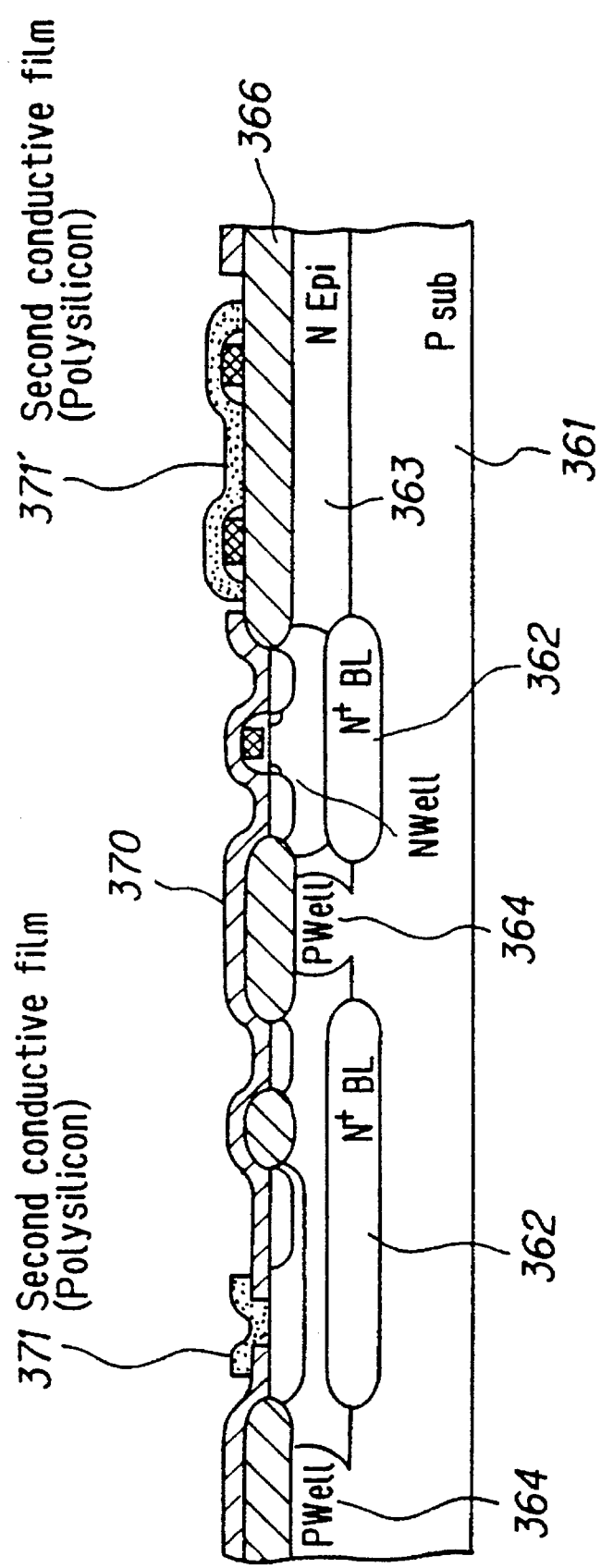
Figure 20:
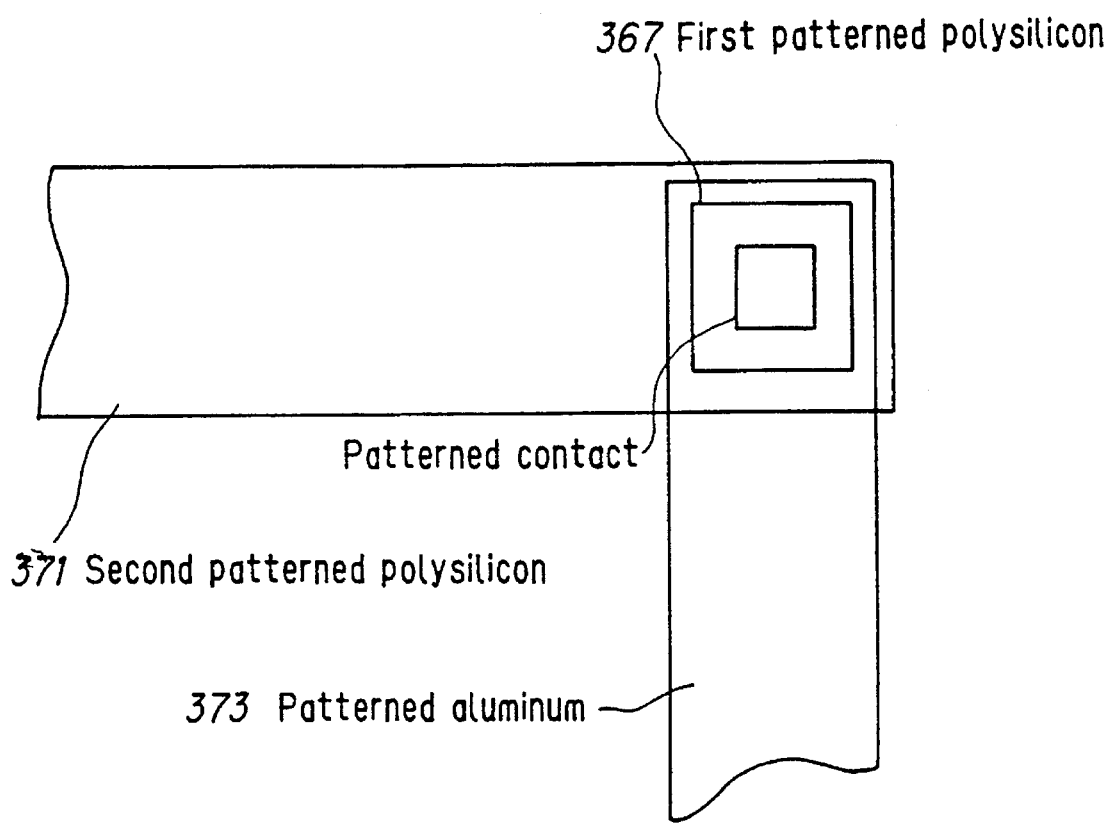
FIG. 20 shows a plan view of a pattern formed in the process for fabricating a BiCMOS device according to a seventh and eighth embodiment of the present invention.

The BiCMOS semiconductor device according to the present embodiment is fabricated to a final structure shown in FIG. 17 by a process comprising the sequential steps shown in FIGS. 19A to 19C. The process comprises:

forming, on a semiconductor substrate (a P-type silicon substrate) whose structure is shown in FIG. 19A, first conductive films (using polysilicon in this case) 367, 367", and 367'", on a gate insulator film of the region for forming the MOS transistor and on a region for forming a contact electrode for a resistor formed from a desired conductor film, thereby obtaining a structure shown in FIG. 19B;

forming an insulator film on the surface of the resulting substrate;

removing the thus deposited insulator film from regions on which the emitter of the bipolar transistor and the resistor using a desired conductor film are to be formed; and forming a second conductor film 371 and 371' on an arbitrary region inclusive of the opening of the above insulator film formed on the region for forming the emitter of the bipolar transistor, and on the region for forming a resistor using a desired conductor film (a resistor to be formed on a polysilicon conductor 371') inclusive of the portion for forming a contact electrode of the resistor using a desired conductor film. The plan view of the pattern for the semiconductor device of the present embodiment is given in FIG. 20.

The step sequence of the process according to the present embodiment is described in further detail referring to the attached drawings. FIG. 19A shows a cross sectional view of the device immediately after LOCOS formation.

After forming the gate oxide film, a polysilicon layer is deposited as a first conductive film to obtain therefrom a 400 nm thick polysilicon gate. At the same time, a conductor film for forming the gate polysilicon is patterned on the region for forming thereon a polysilicon resistor; i.e., a conductor film is left over on this region. After introducing ions into the LDD region by ion implantation, a side wall $SiO_2$ is formed. This step is followed by ion implantation of the base region, source and drain (base contact) regions, and collector contact regions. The resulting structure is illustrated in FIG. 19B.

Referring to FIG. 19C, a 100 nm thick $SiO_2$ layer is deposited using TEOS to provide an insulator film 370. The insulator film 10 is partially removed from the region for forming thereon a polysilicon resistor. Then, a 70 nm thick polysilicon is deposited by CVD to provide second conductor film portions 371 and 371', and the portions of the film corresponding to the emitter region and the resistor region, respectively, are doped with impurities. For instance, the emitter region is doped with arsenic (As) under an energy of 70 KeV to a concentration of $1\times10^{16}$ cm, and the resistor region is doped with boron fluoride ($BF_2$) under an energy of 70 KeV to a concentration of $1\times10^{14}$ cm. The polysilicon conductor film is then patterned to form an emitter polysilicon (conductor film 371) pattern and a resistor polysilicon (conductor film 371') pattern.

Figure 2:
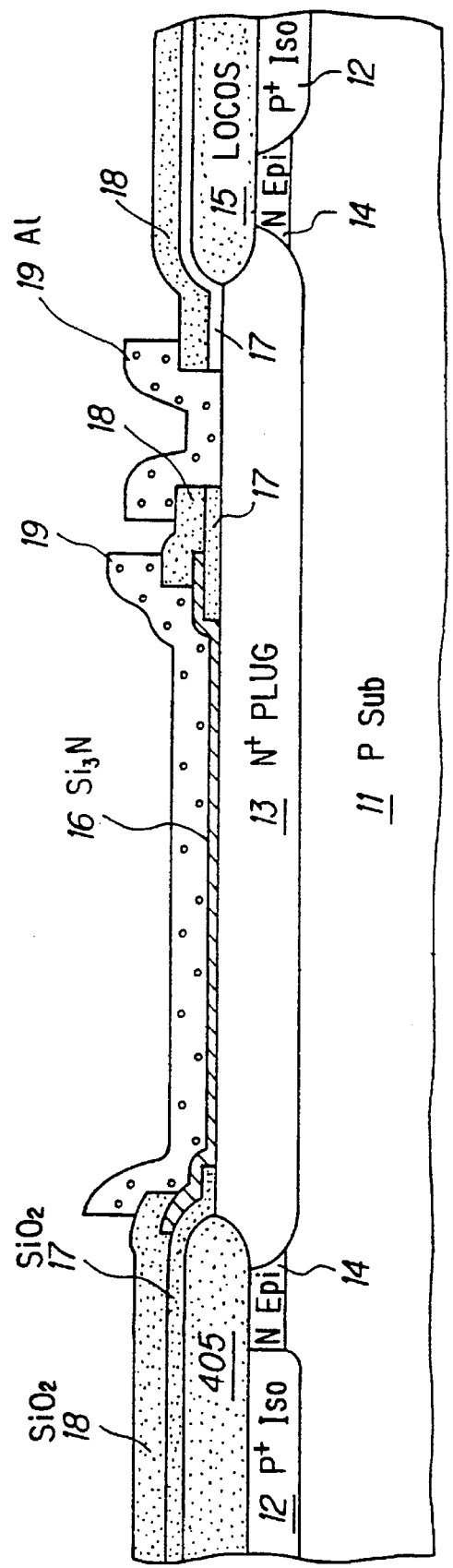
FIG. 2 is a cross sectional view showing the structure of a MIS capacitor according to a second related art.
Figure 3:
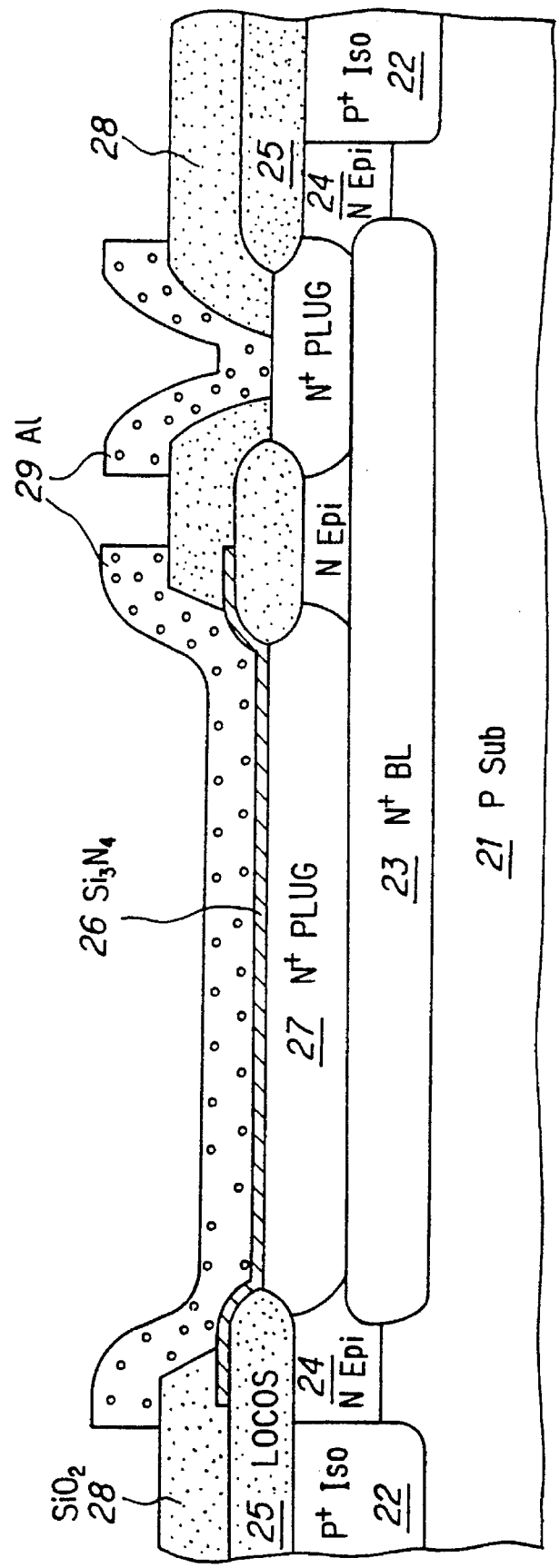
FIG. 3 is another cross sectional view showing the structure of a MIS capacitor according to a second related art.
Figure 4:
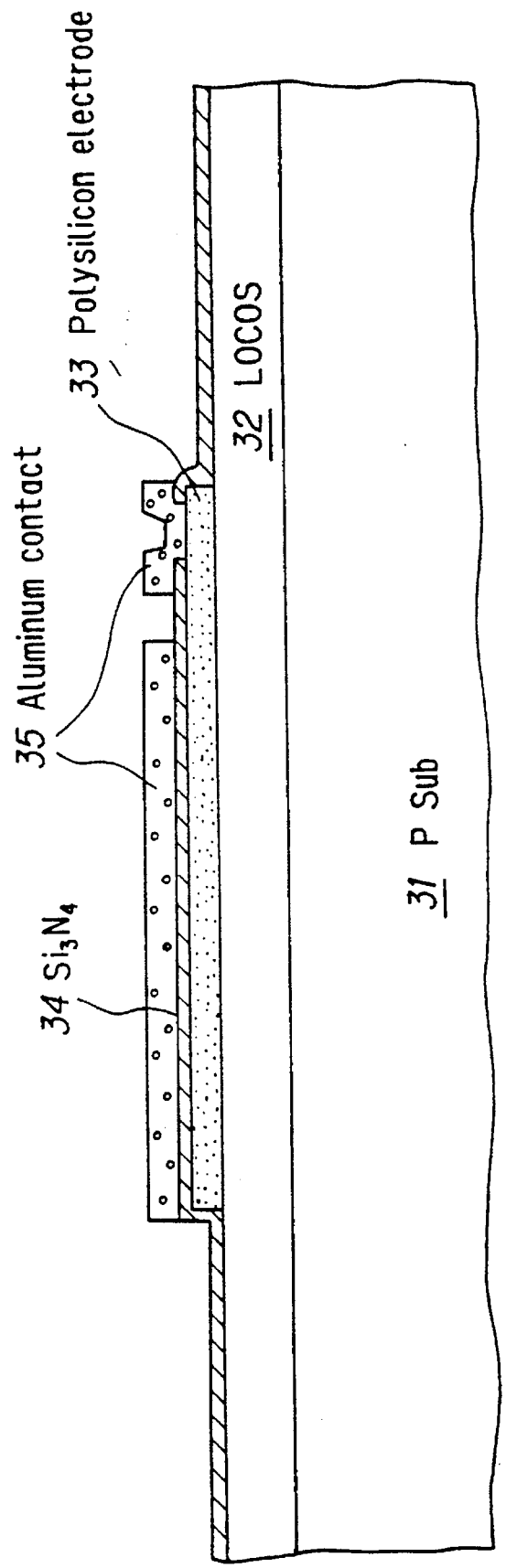
FIG. 4 is a cross sectional view showing the structure of a MIS capacitor according to a third related art.
Figure 5A:
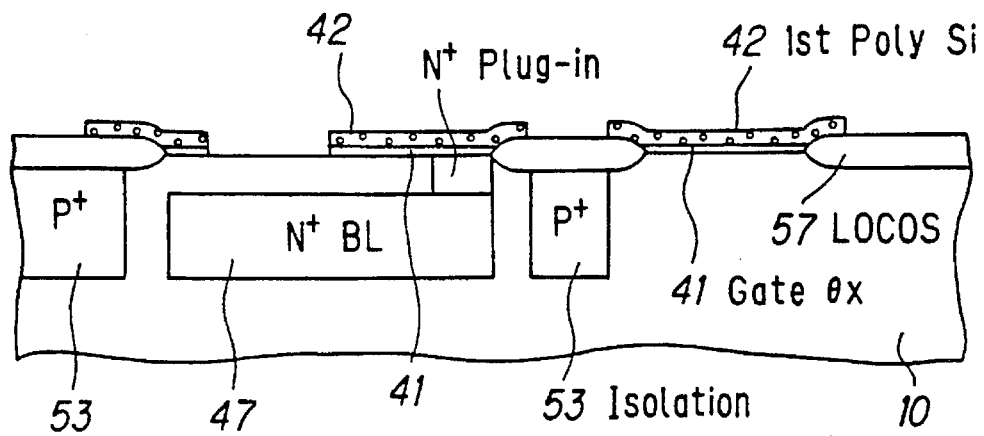
FIGS. 5A to 5D are step sequence diagrams showing the process for forming a MIS capacitance of a BiCMOS device according to a fourth related art.
Figure 5B:
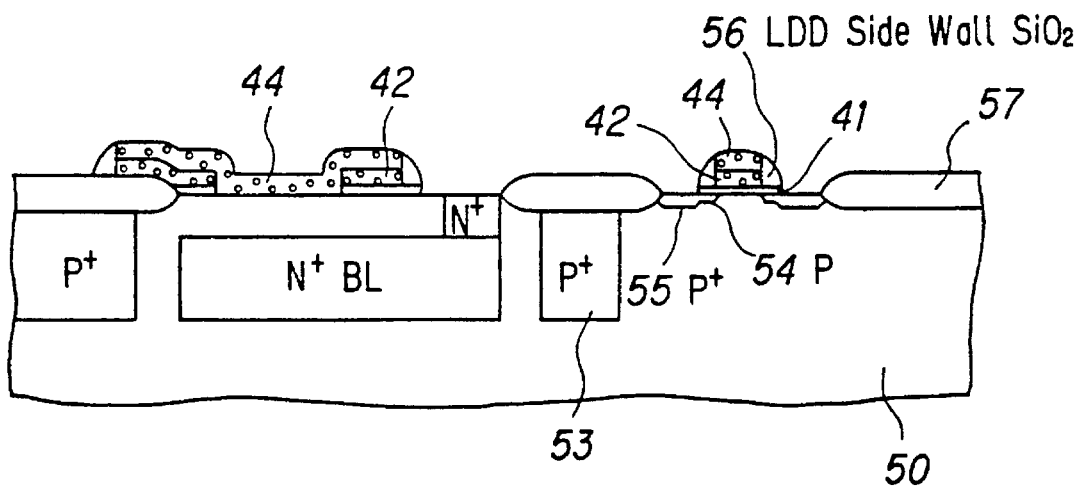
Figure 5C:
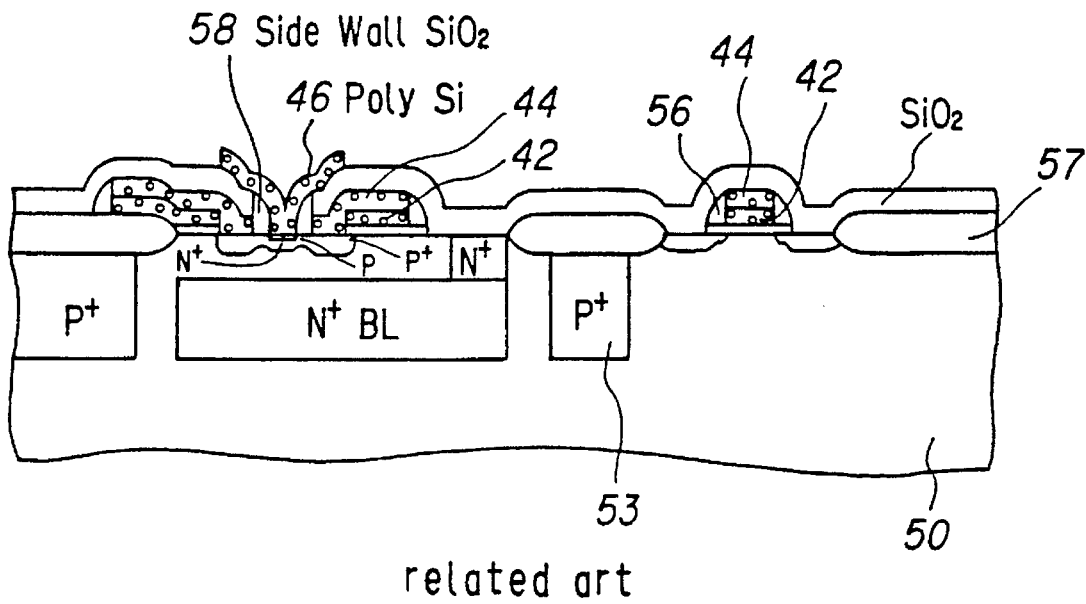
Figure 5D:
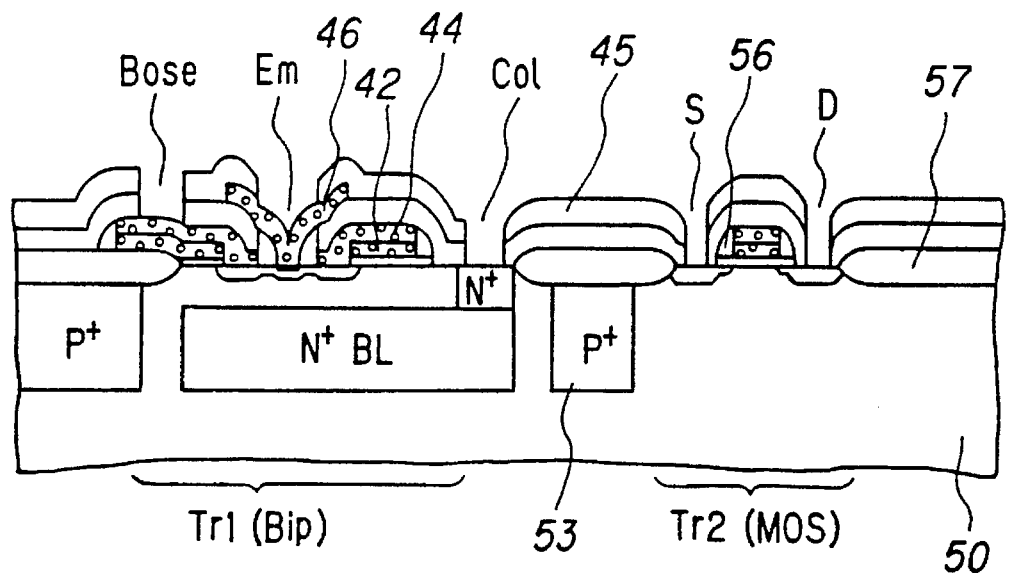
Figure 6A:
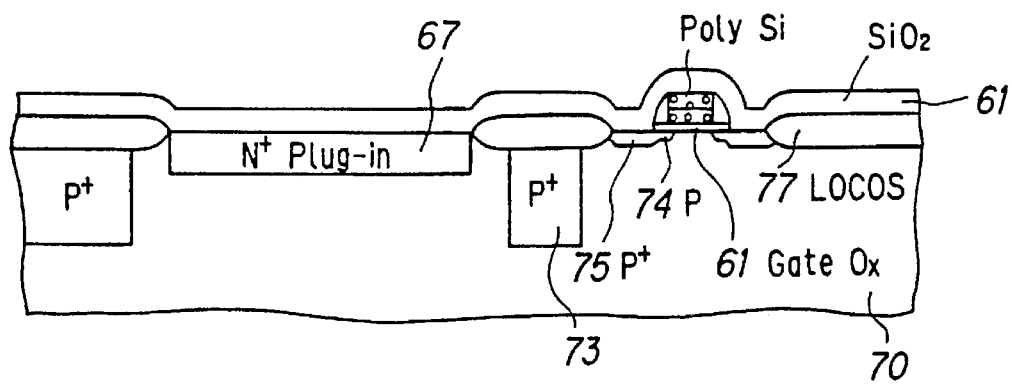
FIGS. 6A to 6C are step sequence diagrams showing the process for forming a MIS capacitance of a BiCMOS device according to a fifth related art.
Figure 6B:
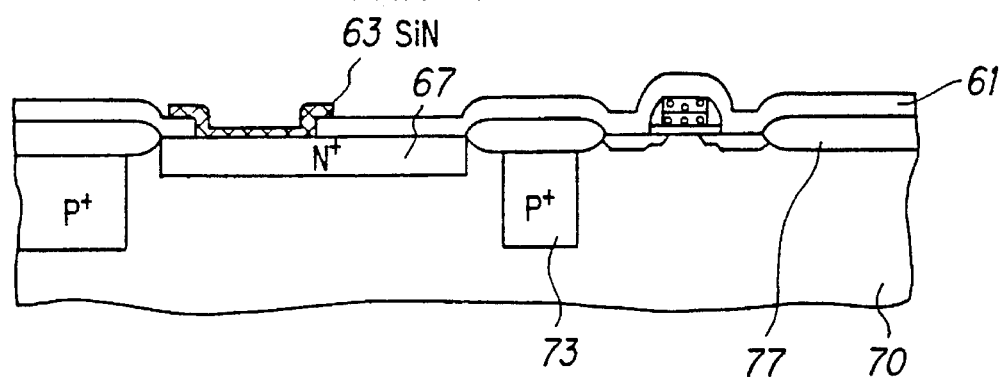
Figure 6C:
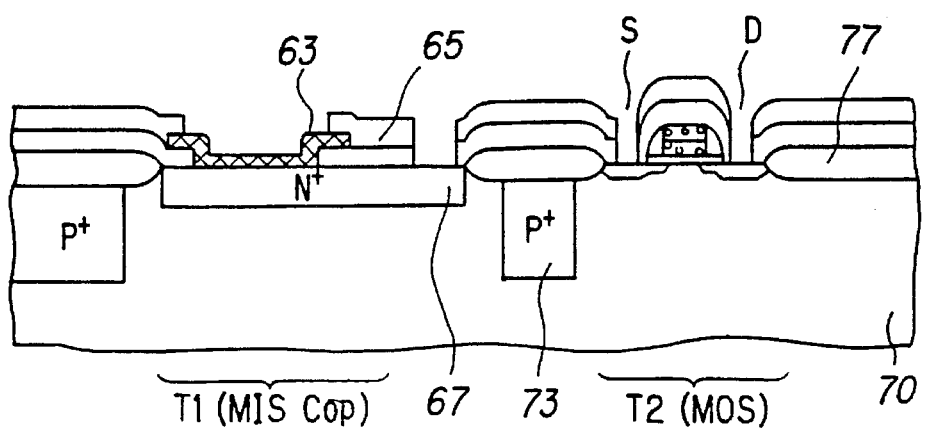
Figure 7A:
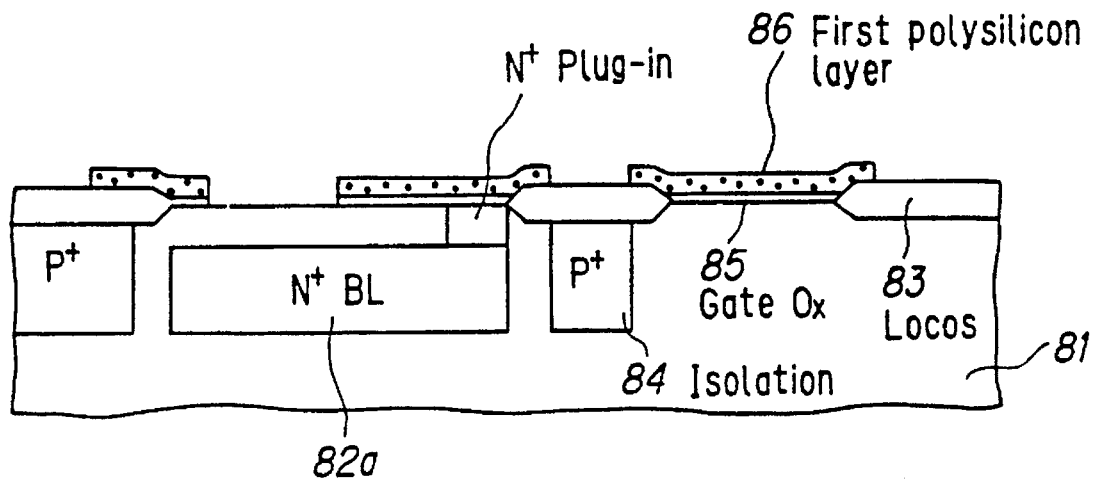
FIGS. 7A through 7D are step sequence diagrams showing the process for forming a MIS capacitance of a BiCMOS device according to a sixth related art.
Figure 7B:
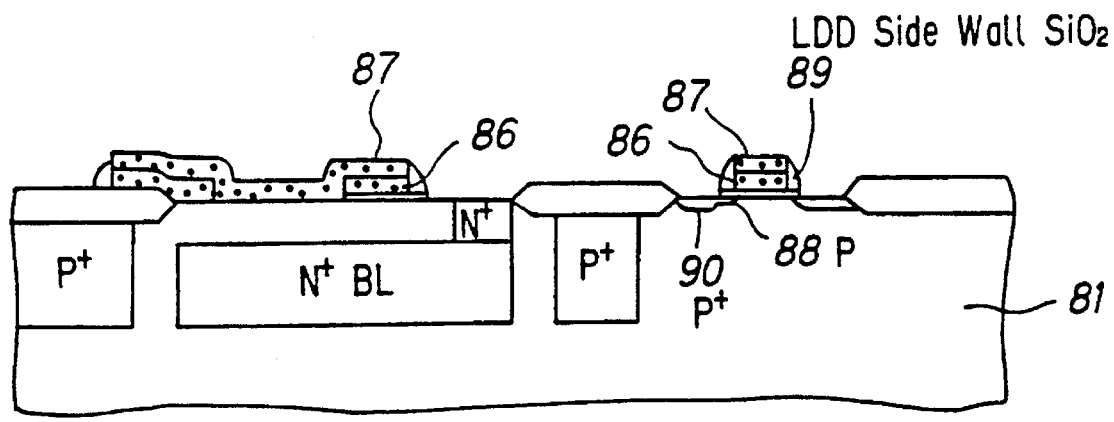
Figure 7C:
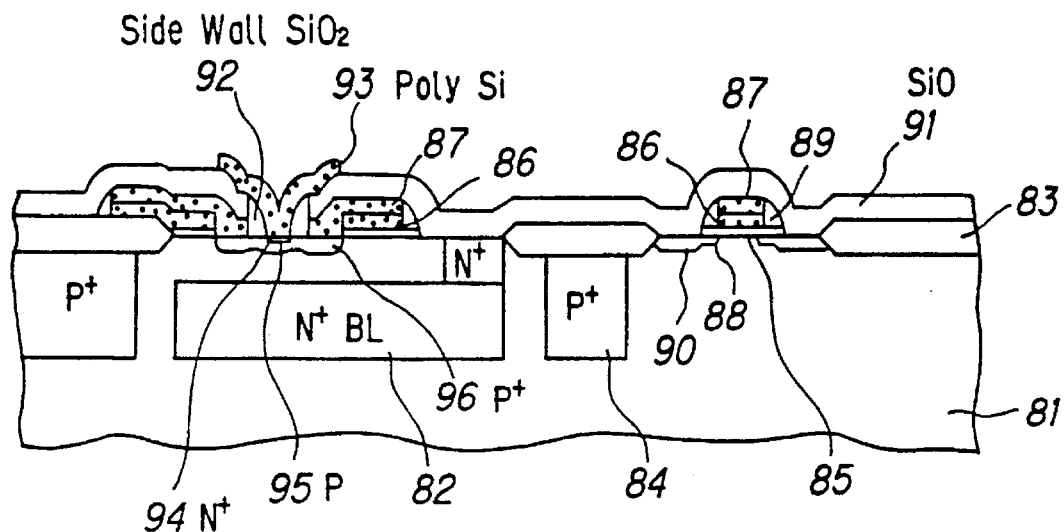
Figure 7D:
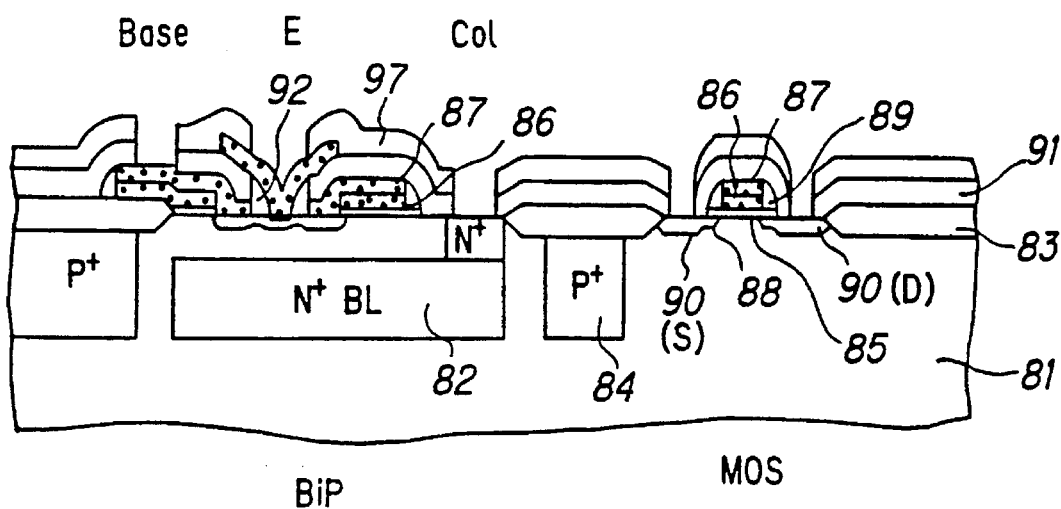
Figure 8A:
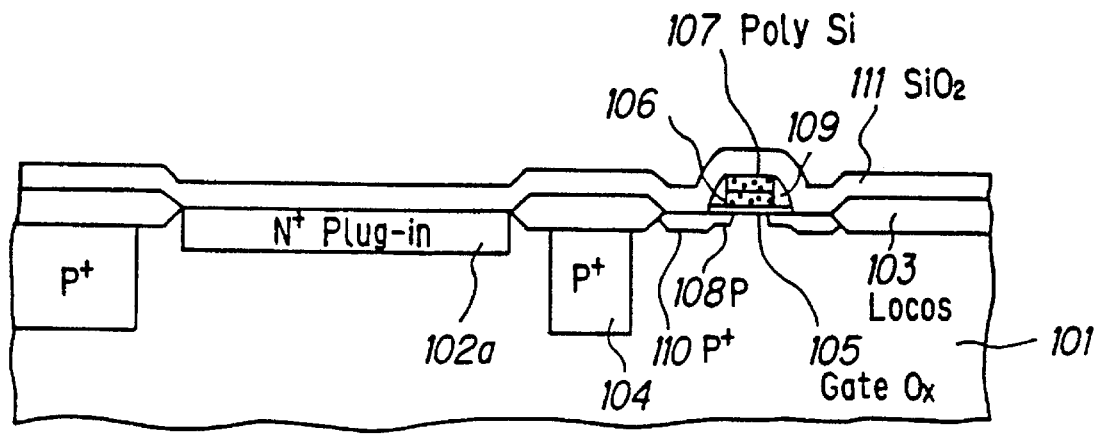
FIGS. 8A to 8C are step sequence diagrams showing the process for forming a MIS capacitance of a BiCMOS device according to a seventh related art.
Figure 8B:
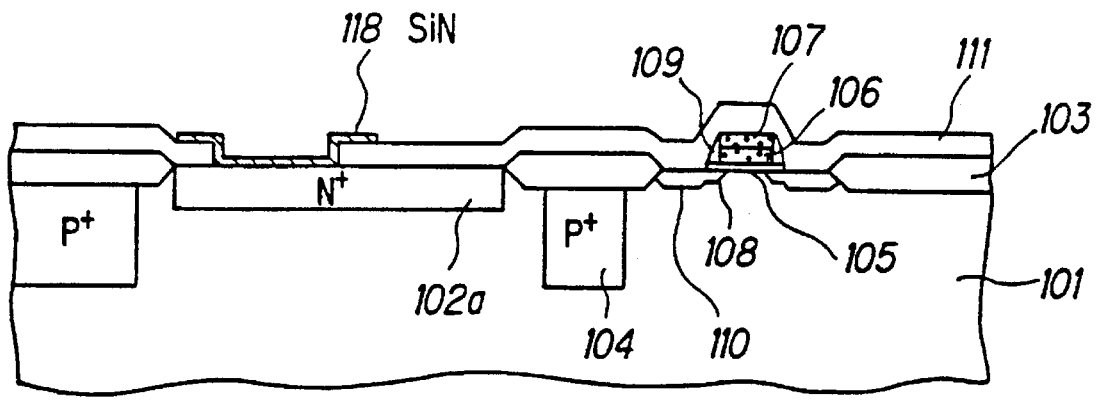
Figure 8C:
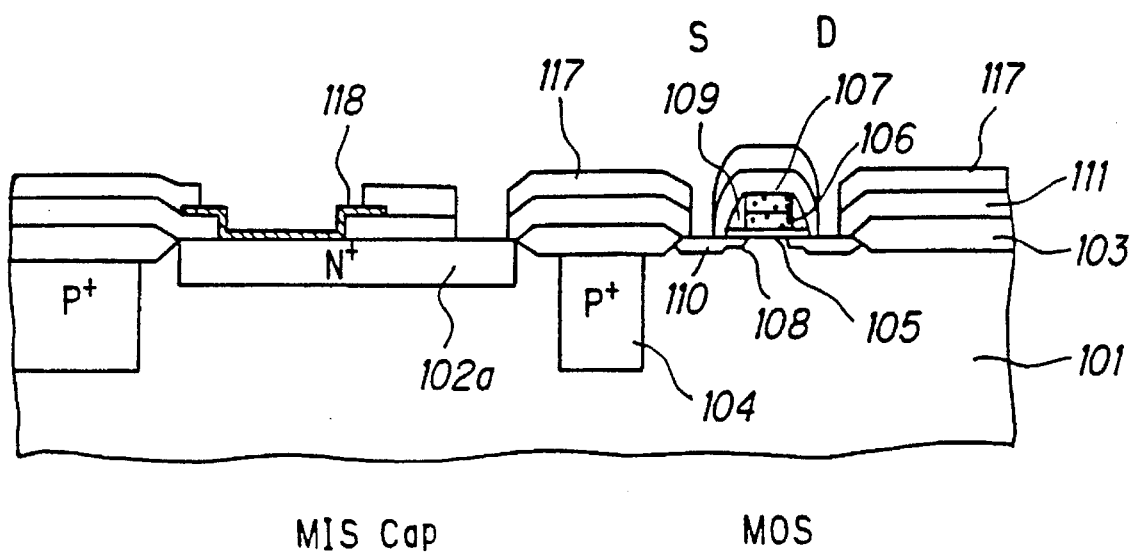
Figure 9A:
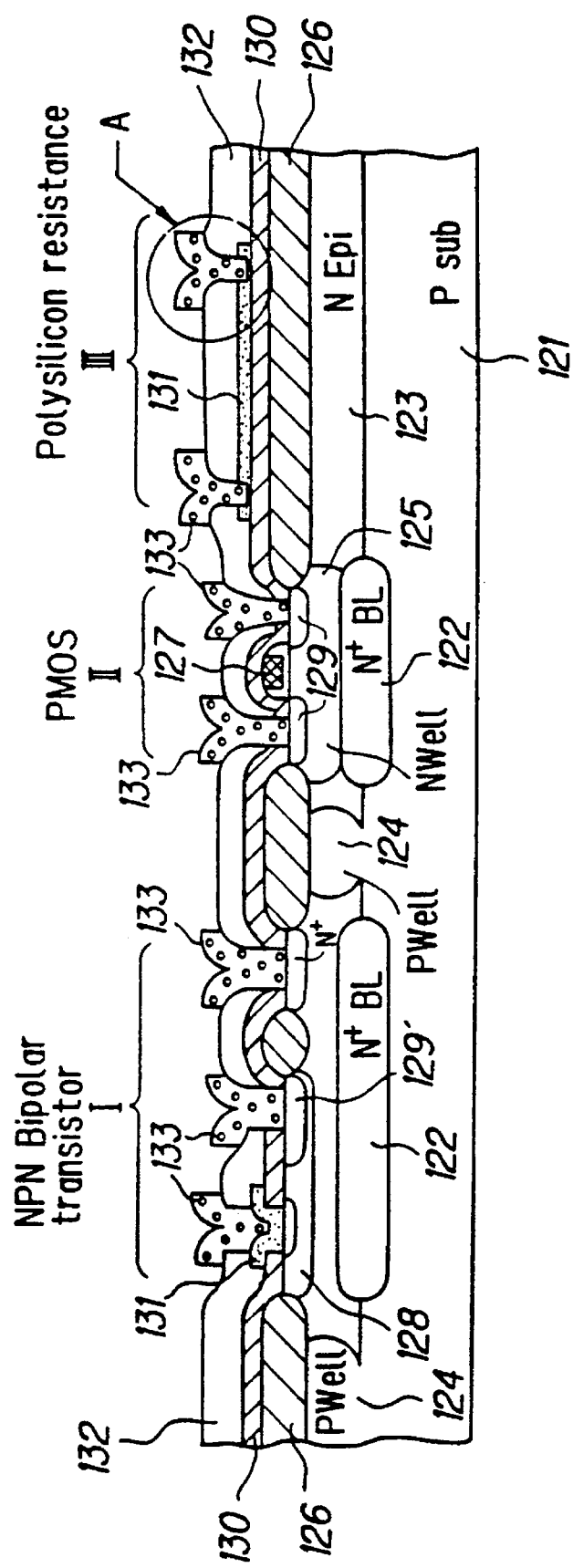
FIGS. 9A and 9B are step sequence diagrams showing the process for forming a polysilicon resistor of a BiCMOS device according to an eighth related art.
Figure 9B:
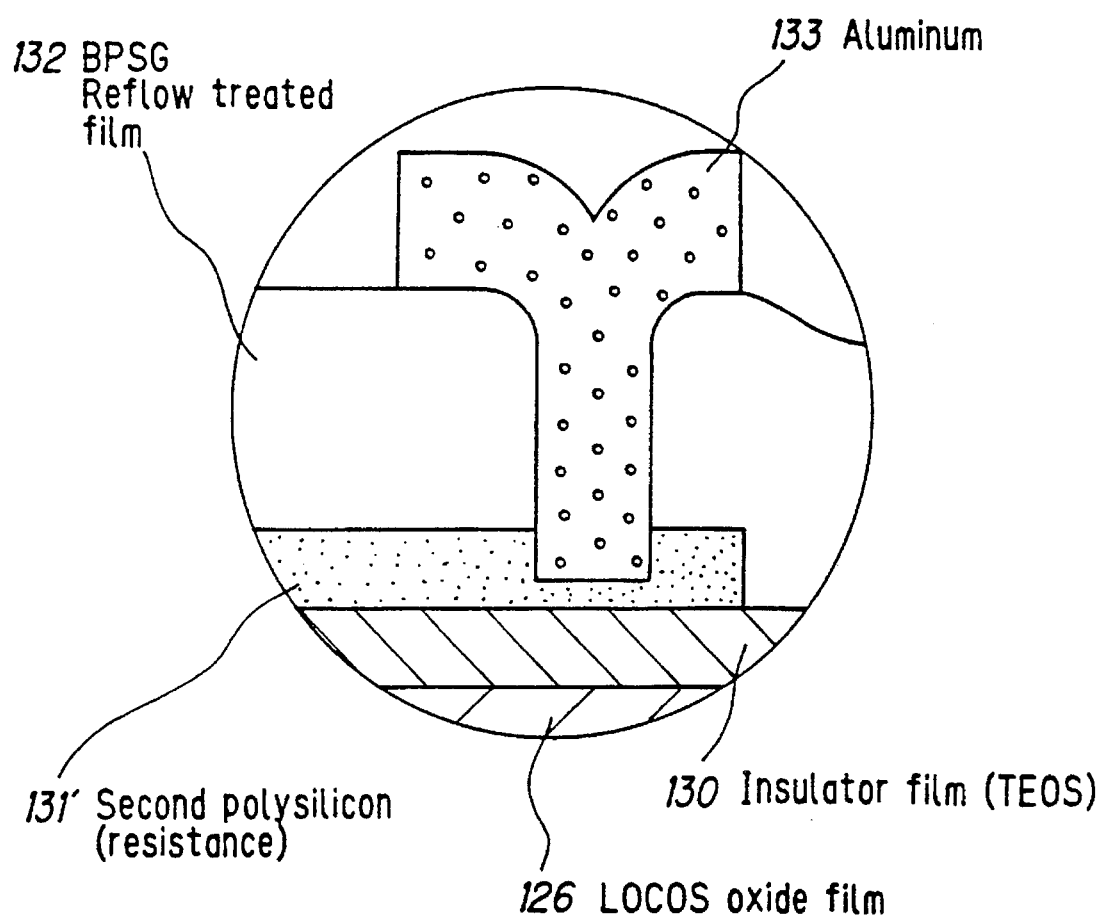

Then, after depositing a 600 nm thick BPSG by CVD, a contact is perforated by performing RIE etching under a condition as such that it may include a margin for perforating a 700 nm thick contact region of the transistor. As described hereinbefore as the problem of a prior art process, of course, the polysilicon film used for the resistor is also removed. Referring to FIG. 2, however, since the film thickness for this region is substantially 470 nm, a sufficiently reliable contact can be obtained even if the film is shaved for a several tens of nanometer in thickness.

As described in the foregoing, the present embodiment provides a BiCMOS semiconductor device, and particularly, a device having a bipolar transistor, a MOS transistor, and a polysilicon resistor on a single substrate, which comprises a polysilicon film resistor sufficiently thin and thereby having an increased resistivity. The present embodiment enables the formation of this polysilicon resistor without suffering the problem of excessively thinning the polysilicon film of the contact region due to overetching during the contact step, and yet, without adding any step nor modifying the conventional process.

Thus, the present embodiment provides a highly reliable semiconductor device in which the reduction of contact resistance of the polysilicon resistor is realized.

The embodiment above was described referring to a specific case comprising a PNP transistor, a PMOS, and a polysilicon transistor. As a matter of course, however, other elements such as an NMOS, a PNP transistor, and a capacitor are incorporated in the implementation of a practical device.

A seventh embodiment according to the present invention is described below.

The present embodiment is essentially the same as that of the sixth embodiment, except for using a metal in the place of polysilicon for the conductor film. Accordingly, the same effect as that obtained in the case of the sixth embodiment can be obtained in the present embodiment.

An eighth embodiment according to the present invention comprises using a substance comprising an alloy of polysilicon and a metal in the place of polysilicon conductor film in the sixth embodiment. Accordingly, the same effect as that obtained in the case of the sixth embodiment can be obtained in the present embodiment.

As described in the foregoing, the present invention provides a semiconductor device having a resistor made of a conductor such as polysilicon, in which the contact of the thin polysilicon (conductor) resistor having high resistance can be obtained with superior reliability, yet using a desired process, for example, an RIE process suited for fine processing. The present invention also provides a reliable process for fabricating the same device.

While the invention has been described in detail and with reference to specific embodiments thereof, it will be apparent to one skilled in the art that various changes and modifications can be made therein without departing from the spirit and scope thereof.

What is claimed is:

1. A process for fabricating a semiconductor device comprising:

forming an oxide film on a silicon layer;

depositing a first electrically conductive material on said oxide film, followed by forming a first electrically conductive film having a pattern;

forming a first insulator film over an entire surface of the resulting structure, followed by partially forming an opening in said first insulator film;

forming a second electrically conductive film on said opening;

forming, over an entire surface of the resulting structure, a second insulator film which functions as an insulator of a MIS capacitor, followed by further forming a third insulator film on said second insulator film;

forming a contact hole over said first electrically conductive film by sequentially removing said third insulator film, said second insulator film, and said first insulator film;

removing said third insulator film from an upper portion of said second insulator film; and after depositing a third electrically conductive material over the entire surface of the resulting structure, forming a third electrically conductive film having a pattern.

2. A process for fabricating a BiCMOS semiconductor device having a bipolar transistor, a MOS transistor, and a resistor formed from a conductor film, comprising:

forming a first electrically conductive film, both on a gate insulator film formed in a region of a substrate in which said MOS transistor is formed, and on a surface of a region of the substrate in which an electrode contact for the said resistor is formed;

forming an insulator film on a surface of said substrate;

removing said insulator film from a region in which an emitter of said bipolar transistor and said resistor are formed; and forming a second electrically conductive film, on a region in which the emitter of said bipolar transistor is formed and inclusive of an opening of said insulator film, and on the region in which said resistor is formed and at least inclusive of the region in which the electrode contact is formed.

\* \* \* \* \*